US012620548B2

(12) United States Patent
Own et al.

(10) Patent No.: US 12,620,548 B2
(45) Date of Patent: May 5, 2026

(54) TRANSMISSION ELECTRON MICROSCOPY

(71) Applicant: Mochii, Inc., Seattle, WA (US)

(72) Inventors: Christopher Su-Yan Own, Seattle, WA (US); Matthew Francis Murfitt, Seattle, WA (US)

(73) Assignee: Mochii, Inc., Seattle, WA (US)

( * ) Notice: Subject to any disclaimer, the term of this patent is extended or adjusted under 35 U.S.C. 154(b) by 0 days.

(21) Appl. No.: 15/339,922

(22) Filed: Oct. 31, 2016

(65) Prior Publication Data

US 2019/0287759 A1 Sep. 19, 2019

Related U.S. Application Data

(60) Provisional application No. 62/248,423, filed on Oct. 30, 2015.

(51) Int. Cl.
| | |
|---|---|
| *H01J 37/26* | (2006.01) |
| *H01J 37/06* | (2006.01) |
| *H01J 37/147* | (2006.01) |
| *H01J 37/20* | (2006.01) |
| *H01J 37/22* | (2006.01) |
| *H01J 37/244* | (2006.01) |
| *H01J 37/28* | (2006.01) |

(52) U.S. Cl.
CPC .............. *H01J 37/28* (2013.01); *H01J 37/06* (2013.01); *H01J 37/147* (2013.01); *H01J 37/1477* (2013.01); *H01J 37/20* (2013.01); *H01J 37/222* (2013.01); *H01J 37/244* (2013.01); *H01J 37/26* (2013.01); *H01J 2237/049* (2013.01); *H01J 2237/151* (2013.01); *H01J 2237/2802* (2013.01)

(58) Field of Classification Search
CPC .... H01J 37/1474; H01J 37/1477; H01J 37/28; H01J 2237/201
See application file for complete search history.

(56) References Cited

U.S. PATENT DOCUMENTS

| | | | |
|---|---|---|---|
| 5,852,298 A | 12/1998 | Hatakeyama | |
| 6,570,156 B1 * | 5/2003 | Tsuneta ................... | H01J 37/26 |
| | | | 250/311 |
| 9,304,067 B2 | 4/2016 | Hayworth et al. | |
| 9,784,648 B2 | 10/2017 | Hayworth et al. | |

(Continued)

OTHER PUBLICATIONS

Passy 'Angles and Parallel Lines' Sep. 13, 2012, posted at http://passyworldofmathematics.com/angles-and-parallel-lines/.*

(Continued)

*Primary Examiner* — Eliza W Osenbaugh-Stewart
(74) *Attorney, Agent, or Firm* — Nienstadt PLLC

(57) ABSTRACT

A transmission electron microscope is provided for imaging a sample. The microscope has a stage to hold a sample and an electron beam column to direct an electron beam onto a field of view on the sample. The electron beam column includes an electron beam source to generate an electron beam, and electron beam optics to converge the electron beam onto a field of view on the sample. The microscope also has a beam scanner to scan the electron beam across multiple fields of view on the sample. The microscope additionally has a detector to detect radiation emanating from the sample to generate an image. A controller is provided to analyze the detected radiation to generate an image of the sample.

20 Claims, 17 Drawing Sheets

(56) References Cited

U.S. PATENT DOCUMENTS

| | | | | |
|---|---|---|---|---|
| 2002/0084422 A1* | 7/2002 | Kienzle | | H01J 37/1474 |
| | | | | 250/396 ML |
| 2003/0201393 A1* | 10/2003 | Tsuneta | | H01J 37/26 |
| | | | | 250/311 |
| 2006/0008790 A1* | 1/2006 | Hayworth | | G01N 1/06 |
| | | | | 435/1.1 |
| 2006/0151701 A1* | 7/2006 | Tsuneta | | H01J 37/1474 |
| | | | | 250/310 |
| 2007/0023659 A1* | 2/2007 | Sergeevich | | G01N 23/20058 |
| | | | | 250/311 |
| 2008/0217531 A1* | 9/2008 | Muray | | H01J 37/063 |
| | | | | 250/307 |
| 2010/0246993 A1* | 9/2010 | Rieger | | G06T 5/006 |
| | | | | 382/275 |
| 2012/0025074 A1 | 2/2012 | Barbi | | |
| 2013/0182318 A1 | 7/2013 | Eastman | | |
| 2014/0026683 A1 | 1/2014 | Hayworth et al. | | |
| 2014/0074253 A1 | 3/2014 | Lieber | | |
| 2015/0155134 A1* | 6/2015 | Frosien | | H01J 37/05 |
| | | | | 250/310 |
| 2016/0351371 A1* | 12/2016 | Li | | H01J 37/1477 |
| 2017/0074927 A1* | 3/2017 | Gignac | | G01R 31/307 |
| 2021/0272767 A1* | 9/2021 | Bischoff | | H01J 37/20 |

OTHER PUBLICATIONS

Technai on-line help manual—User interface, Jul. 4, 2012, published by Dartmouth.edu (Year: 2012).*

FEI Product Page for Transmission Electron Microscopes as Captured on May 22, 2001 https://web.archive.org/web/20010522060441/http://www.feic.com/products/index.htm (Year: 2001).*

FEI Software Description Page for Tecnai Electron Microscopes as Captured on Nov. 25, 2005, https://web.archive.org/web/20051125185532/http://feicompany.com/software/software.aspx?id=10 (Year: 2005).*

Kubota et al. "A Carbon Nanotube Tape for Serial-Section Electron Microscopy of Brain Ultrastructure." Nature Communications 9:437 (2018).

Mikula, S. "In-Chamber Reel-to-Reel System for Random-Access vol. Electron Microscopy." Microsc. Microanal. 23 (Suppl 1), 2017.

Pennycook, S. J et al. "Scanning Transmission Electron Microscopy for Nanostructure Characterization." Scanning Microscopy for Nanotechnology, Ch. 6, pp. 152-173. Springer (2006).

Williams, D. B. et al. "Transmission Electron Microscopy: A Textbook for Materials Science." Ch. 22 (excerpt).

C.S. Own et al. "Reel-to-Reel Electron Microscopy: Latency-Free Continuous Imaging of Large Sample Volumes." Microscopy and Microanalysis, 21(S3), 157-158. (2015).

J.H. Wu. "Fabrication and Characterization of Through-Substrate Interconnects." IEEE Transactions on Electron Devices. Jun. 2010. vol. 57, No. 6; p. 1262; Figure 3.

* cited by examiner

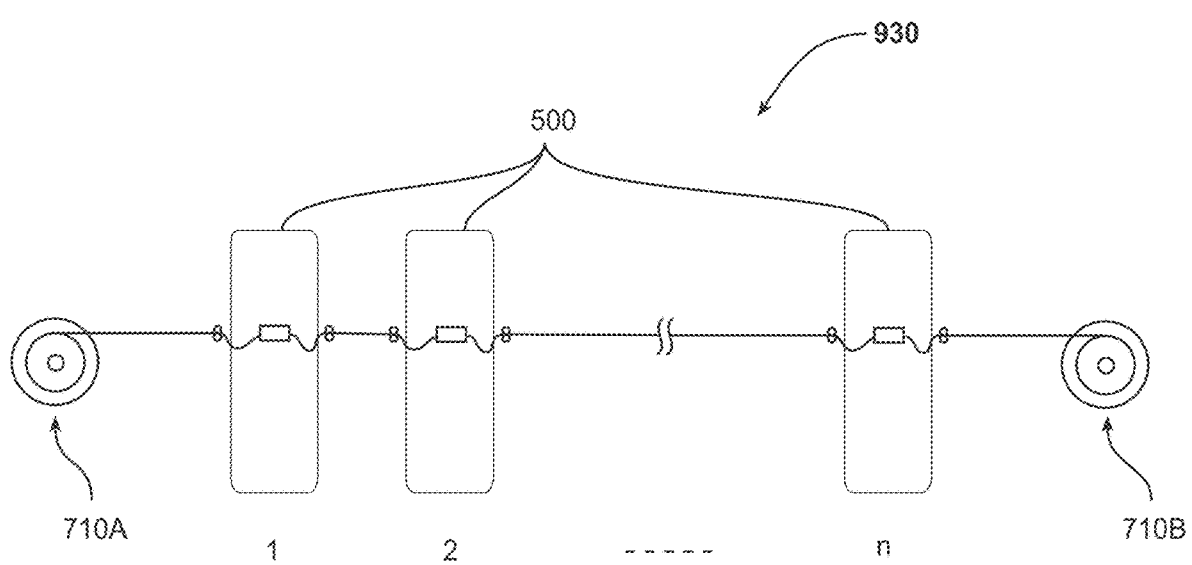
Fig. 18
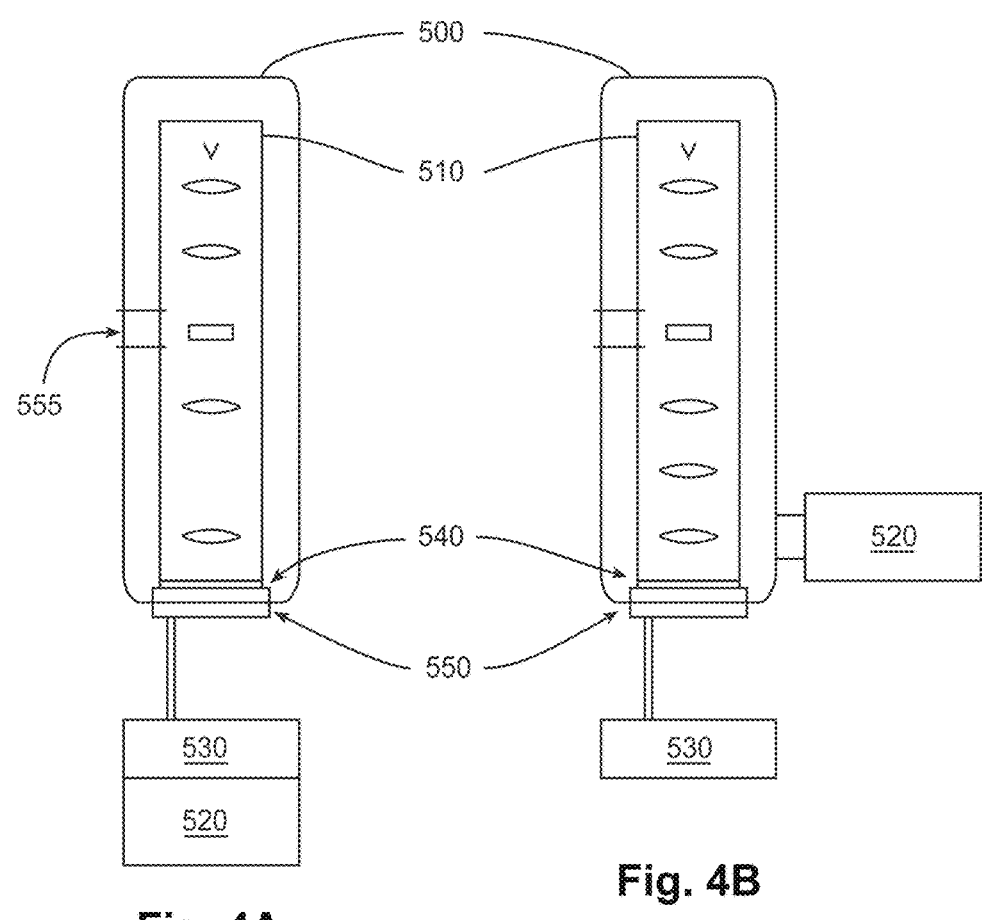
Fig. 4B
Fig. 4A

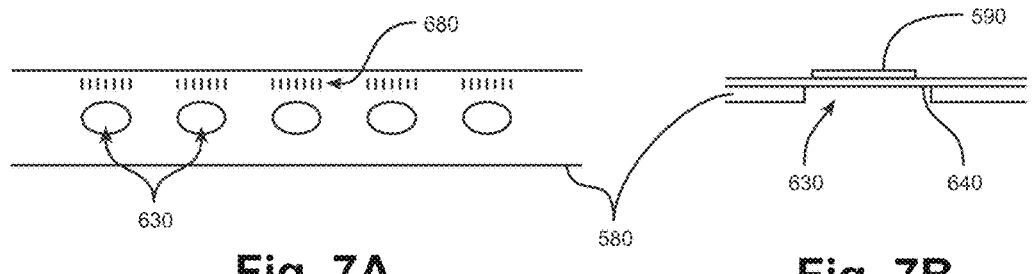
Fig. 7A
Fig. 7B
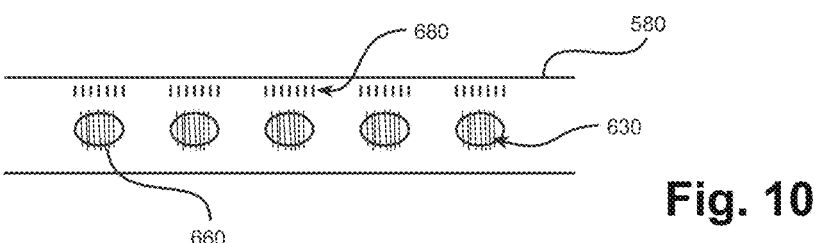
Fig. 8A
Fig. 8B
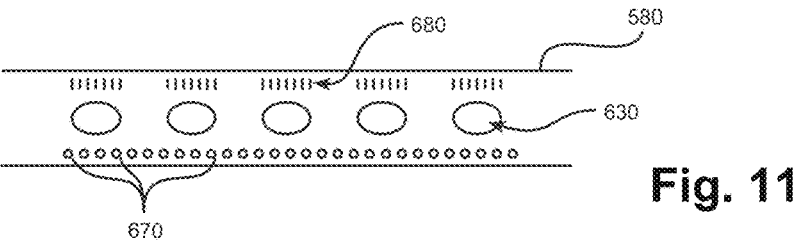
Fig. 10
Fig. 11
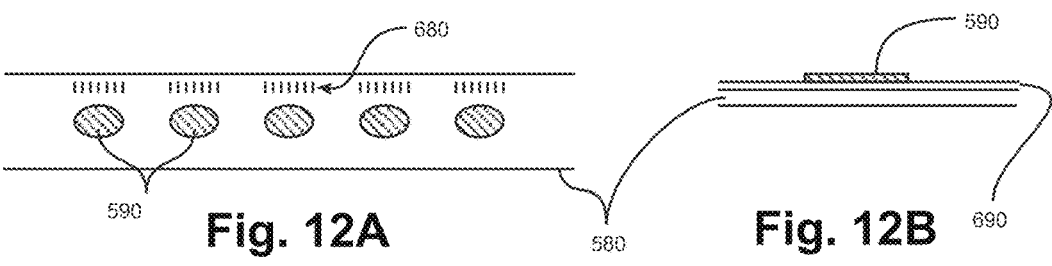
Fig. 12A
Fig. 12B

10

720B

710B

10

720B

730

720A

Fig. 19
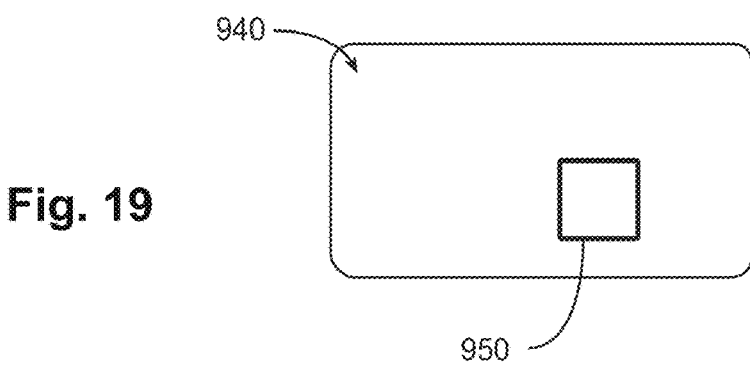
Fig. 20
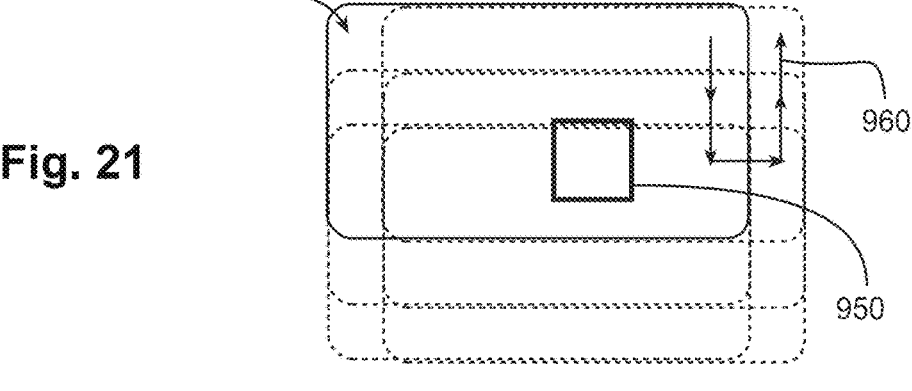
Fig. 21
Fig. 22
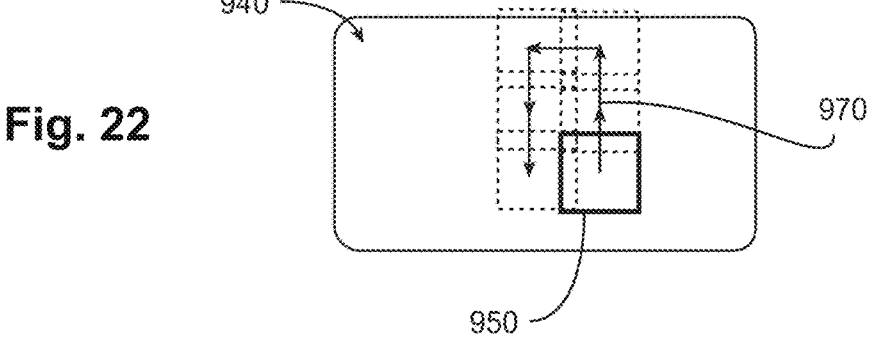

TRANSMISSION ELECTRON MICROSCOPY

CLAIM FOR PRIORITY

This application claims priority under 35 U.S.C. § 119(e) to Provisional Application 62/248,423, filed Oct. 30, 2015, which is incorporated herein by reference in its entirety.

TECHNICAL FIELD

This application relates to improvements in transmission electron microscopy.

BACKGROUND

Charged-particle beam microscopy can be used to image samples at very small dimensions. For example, charged-particle beam microscopy, which includes electron microscopy and focused ion beam microscopy, can be used to investigate samples at dimensions smaller than what is possible using solely light microscopy. Charged-particle beam microscopy may also reveal information that is not readily available through light microscopy, such as in relation to composition, crystallography, and topography of the sample.

However, conventional charged-particle beam microscopes typically have a number of practical disadvantages in terms of speed and cost. Imaging numerous samples by conventional means may be slow and expensive. For example, sequential imaging of multiple samples may require frequent pumping cycles and recurring human manual intervention to insert samples. As another example, transmission electron microscopy (TEM) may require frequent and slow stage movements in order to image a large area of a sample or an entire sample, making it slow and therefore expensive to image large areas. Moreover, when imaging numerous samples, it may be difficult and labor-intensive to track the identity of each sample in relation to its digital image.

Thus, it is desirable to provide charged-particle beam microscopy that can image numerous samples at relatively high speed and low cost. It is also desirable to be able to reliably and efficiently track the identities of each of multiple samples that are being imaged through charged-particle beam microscopy.

SUMMARY

In one embodiment, a transmission electron microscope is provided for imaging a sample. The microscope comprises a stage to hold a sample and an electron beam column to direct an electron beam onto a field of view on the sample. The electron beam column comprises an electron beam source to generate an electron beam, and electron beam optics to converge the electron beam onto a field of view on the sample. A beam scanner scans the electron beam across multiple fields of view on the sample, and a detector detects radiation emanating from the sample to generate an image. A controller is provided to analyze the detected radiation to generate an image of the sample.

In another embodiment, a method is provided for imaging a sample. The method comprises holding a sample in a low-pressure environment, generating an electron beam, and converging the electron beam onto a field of view on the sample. The electron beam is scanned across multiple adjacent or overlapping fields of view on the sample, without moving the stage between a plurality of these scans. Radiation emanating from the field of view on the sample is detected to generate an image. The detected radiation is analyzed to generate an image of the sample.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

FIGS. 4A and 4B are schematic side views of examples of embodiments of modular TEM columns.

FIGS. 7A and 7B are top and side views of an example of an embodiment of a tape that is supporting samples and that contains identification codes for the samples, for transmission electron microscopy (TEM).

FIGS. 8A and 8B are top and side views of an example of an embodiment of a tape that is supporting sample carriers with samples thereon and that contains identification codes for the samples, for TEM.

FIG. 10 is a top view of an example of an embodiment of a tape that is supporting multiple samples on each of a plurality of apertures, for TEM, where the samples are linear polymer strands.

FIG. 11 is a top view of the tape embodiment shown in FIG. 7A, but with sprocket holes along an edge of the tape to permit being driven by a sprocket drive.

FIGS. 12A and 12B are top and side views of an example of an embodiment of a tape that is supporting samples and that contains identification codes for the samples, for scanning electron microscopy (SEM).

FIG. 18 is a schematic diagram of an example of an embodiment of an array of microscope columns that are being serially fed a tape of samples by a reel-to-reel sample feeder.

FIGS. 19, 20, 21, 22, and 23 are schematic diagrams of top views of fields of view of a TEM on a sample area of interest.

DETAILED DESCRIPTION

A charged-particle beam microscope such as a transmission electron microscope (TEM), scanning electron microscope (SEM), scanning transmission electron microscope (STEM), or focused ion beam (FIB) microscope may be adapted and used advantageously to image and analyze samples. The microscope may illuminate the sample with one or more charged-particle beams (such as electron beams) and detect radiation from the sample to generate an image of the sample. A TEM, for example, converges an electron beam into a "field of view" on the sample to image that field. A SEM or STEM, meanwhile, scans an electron beam that is formed into a probe across the sample to generate an image pixel-by-pixel. The images may be evaluated, such as by a human user of the microscope or automatically, to identify characteristics of the sample.

Figure 1:
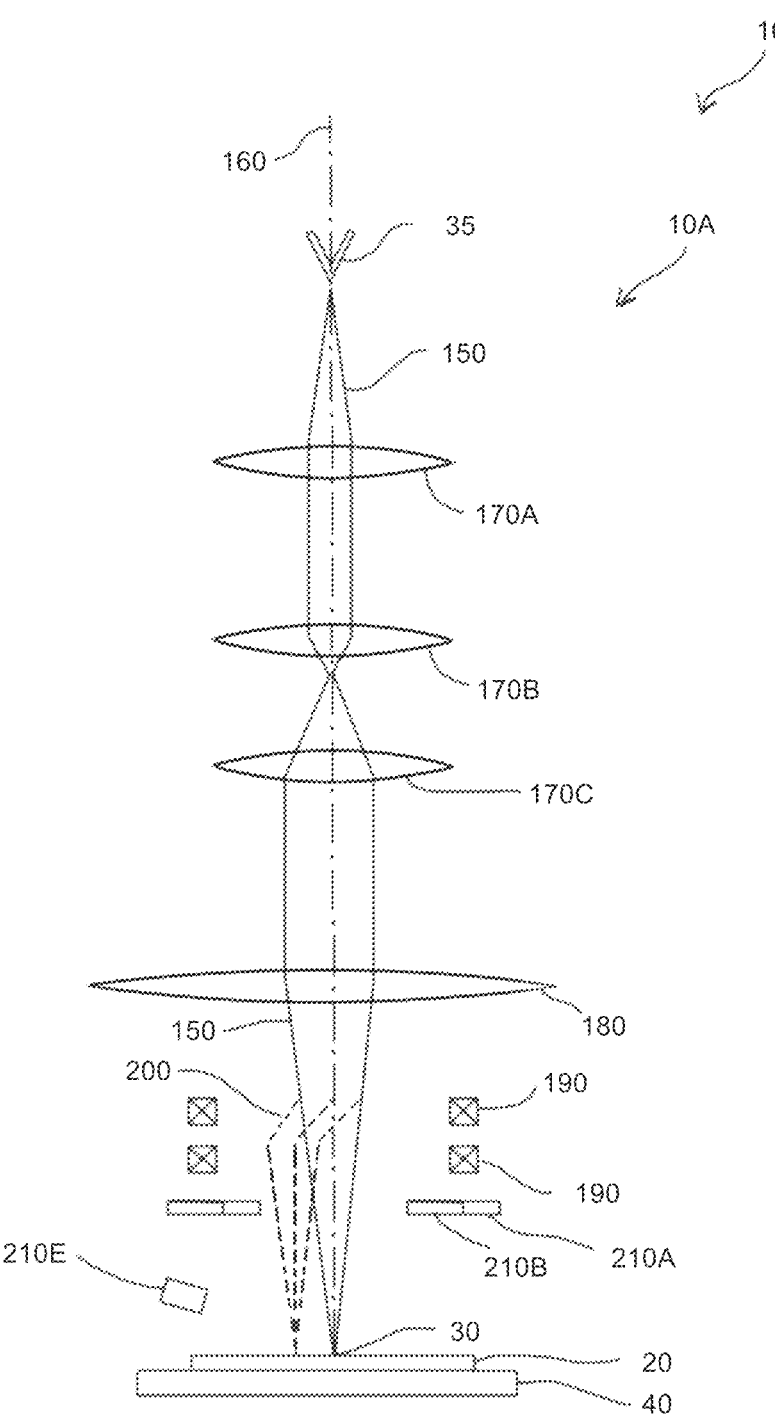
FIG. 1 is a schematic diagram of an example of an embodiment of a scanning electron microscope (SEM).

FIG. 1 is a schematic diagram of an example of an embodiment of a microscope 10 that is a SEM 10A, provided for the sake of illustration. SEM 10A has a housing that, when closed, is substantially airtight and defines a chamber with an enclosed volume therein. A sample 20 can be placed inside SEM 10A, such that an area of sample 20 can be exposed to an electron beam probe 30 for imaging. Sample 20 may include and be supported, for example, by a substrate (not shown). Sample 20 may be of any quantity, may be of any suitable shape or size, and may include any desired features. For example, sample 20 may include a specific configuration for a desired application or parameter setting. In another embodiment, discussed in further detail below, sample 20 is a reference (or "test") sample used for testing or optimization purposes, such as containing gold nano-particles. The substrate that can be used to support sample 20 may include a layer of crystalline or amorphous carbon. Single-atomic-layer graphene may also be used. Alternatively or in addition, the substrate may include boron nitride, silicon, silicon dioxide, aluminum, polymeric resins, or organic materials.

SEM 10A may have a stage 40 to support and move sample 20 within SEM 10A. Stage 40 may be adapted to move sample 20 in one (e.g., "x-axis"), two (e.g., "x- and y-axes"), or three dimensions (e.g., "x-, y-, and z-axes"), and/or to tilt sample 20 (e.g., "a" and/or "3"). This stage movement can allow imaging of different regions of sample 20 (i.e., "x- and y-axes"), forward or backward positioning of sample 20 along the axis of the electron beam (i.e., "z-axis") to achieve different imaging characteristics, and imaging of sample 20 from different incidence angles (i.e., "a" and/or "3").

For example, stage 40 may be a piezoelectric stage. The piezoelectric stage may have a piezoelectric motor that is capable of moving the stage very quickly and smoothly so that short exposures on the order of milliseconds or microseconds can be practically achieved. The piezoelectric stage may also be adapted to move the stage with very high positional precision.

SEM 10A further includes an electron beam source 35 to generate an electron beam 150. Electron beam source 35 may be adapted to generate an electron beam having a current of less than about 100 mA. For example, for many applications electron beam source 35 may generate a beam current of from about 10 picoamps to about 1 milliamp. In an especially low-current version, however, electron beam source 35 may be adapted to generate electron beam 150 to have a current of less than about 10 μA, such as less than about 10 pA. Electron beam source 35 may have a filament (e.g., tungsten filament) through which current is passed to generate electrons and a Wehnelt to channel the electrons into a beam. Further, electron beam source 35 may have an accelerating aperture to accelerate the electron beam away from electron beam source 35.

SEM 10A has an optical system through which electron beam 150 travels from source 35 to sample 20, and optionally through which electron beam 150 travels after it has been transmitted through sample 20. The optical system may define an optic axis 160 along which electron beam 150 travels. The optical system may include illumination optics. The illumination optics may include condenser lenses 170A-C to form electron beam 150 into a collimated probe 30 that illuminates sample 20. Condenser lenses 170A-C may consist of, for example, two, three (as shown in the figure), or four lenses. Condenser lenses 170A-C may be magnetic or electrostatic.

The optical system of SEM 10A may also include an objective lens 180 to focus electron beam 150. An objective aperture may be provided in the back focal plane of objective lens 100 or a plane conjugate to the back focal plane to define an acceptance angle, referring to an angle of electron beam 150 that is transmitted through the aperture and allowed to illuminate sample 20. The rays that objective lens 100 focuses to probe 30 on sample 20 are thus limited in angle by the aperture.

One or more beam scanners 190 may be provided to scan electron beam 150 across sample 20. FIG. 1 shows an example of a scanned beam 200 at a second position. Beam scanners 190 may scan electron beam 150 by generating either a magnetic or an electric field. For example, beam scanners 190 may include scan coils that generate an alternating magnetic field. Alternatively, beam scanners 190 may use electrostatic deflectors to scan electron beam 150. In another example, beam scanners 190 may comprise microelectromechanical systems (MEMS) or one or more coil-driven mirrors. Beam scanners 190 may be provided in pairs, such as two or four paired electromagnetic coils or electrostatic deflectors. Beam scanners 190 can be excited with ramp waveforms, causing the collimated probe to be scanned across the sample and thereby producing an intensity signal at the detector unique to the location of the probe on the sample. FIG. 1 shows an example of electron beam 150 being scanned between a first position and a second position 200.

In one version, beam scanners 190 are adapted to provide a larger field of view compared to conventional charged-particle beam microscopes. For example, beam scanners 190 may include double-rocking scan coils, coils with a greater turns ratio, or higher-power (i.e., higher-current) scan coils. Alternatively or in addition to scan coils, beam scanners 190 may include electrostatic deflectors that can slew greater voltages, such as voltages greater than about 15 V. These embodiments can increase the size of the field of view of the microscope. Large field-of-view beam scanners such as those described above may advantageously be used in combination with a long-working-distance optical column to enhance the efficacy of the optical column by enabling larger areas to be surveyed in one image without translation of the sample or multiple images being taken and later montaged.

When sample 20 is illuminated by electron beam 150, electrons interact with sample 20, producing radiation that emerges from the sample surface in a pattern that is collected by one or more detectors 210A, 210B. Detectors 210A, 210B may detect radiation that can include one or more of backscattered electrons, secondary electrons, auger electrons, cathodoluminescence, ionized gas, and x-rays, and generate a corresponding signal.

The electron-beam energy used in SEM 10A may be selected at least in part based on the target resolution, the transmission properties of sample 20, and the energy of the detected radiation. The penetration depth of the beam into sample 20 may be selected to permit the escape and detection of interaction radiation from sample 20. The penetration depth may be selected to be, for example, from about 1 nanometer to several micrometers, such as, for example, a penetration depth on the order of 2 nanometers, to result in a range of sensitivities to surface or subsurface structure.

If electrons of electron beam are reflected or deflected from sample 20, they are considered scattered. For example, electrons scattered back toward the electron-beam source are referred to as backscattered. In one example, backscattered electrons can be successfully detected if they have an energy of at least about 2 keV. As a result, electrons having an energy of from about 2 keV to about 3 keV may have the lowest beam energy appropriate to permit detection of backscatter electrons in this example, unless a backscatter detector of low-energy type is used, in which case backscattered electrons with energies of less than about 1 keV may be detected. Secondary electrons, on the other hand, are produced by secondary processes at sample 20 and may possess far lower energies of, for example, from a few Volts to a few hundred Volts. Thus, the detection of secondary electrons may be compatible with lower beam energies. Lower beam energies have advantages in certain problem spaces, which may include being less destructive to samples, less deeply penetrating (i.e., more surface-sensitive), and requiring lower-cost equipment to generate and stabilize the accelerating potential.

Detectors 210A, 210B may detect charged particles, such as scattered electron beams, emerging from sample 20 at one or more angles. Each of detectors 210A, 210B may comprise, for example, a scintillator and a photosensitive detector. The photosensitive detector may be, for example, a charge-coupled device (CCD). The scintillator produces photons when impacted by charged particles. The photosensitive detector receives that light and outputs a corresponding electrical signal.

The intensity and/or angle of scattered electrons may vary according to the atomic number (Z) of atoms in sample 20. For example, a greater number of electrons may be backscattered and produce a higher-intensity signal at detectors 210A, 210B when atoms of higher atomic number are illuminated. In one embodiment, atoms of sample 20 having higher atomic number scatter electrons to higher angles, while lighter atoms scatter electrons to lower angles, revealing information about the composition of sample 20.

Detectors that are photosensitive may be provided to detect light-emitting phenomena such as cathodoluminescence or fluorescence. These may be the same detectors as or different detectors than the charged-particle-sensitive detectors such as detectors 210A, 210B. For example, a charged-particle-sensitive detector that is made of a scintillator and a photosensitive detector may have a scintillator that is substantially optically transparent, such that photons pass through the scintillator and are detected by the same photosensitive detector.

A photosensitive detector of microscope 10 may even be adapted to be sensitive to particular preselected wavelengths. For example, an array of multiple detectors with varying spectral sensitivity may be provided. Photons within a tight spectral window may be detected by a silicon photomultiplier (SiPM) that amplifies their signal into an electrical signal. Alternatively, a multi-spectrum or broad spectrum SiPM may detect these photons such that photons of multiple preselected wavelengths within a wider range may be detected simultaneously.

In one version, charged-particle-sensitive detectors are configured in one or more concentric annular rings and a central circular disc detector in an approximately cylindrically symmetric detector arrangement to receive the electrons (as shown in FIG. 1). There may be apertures between detectors 210A, 210B. For each range of angles, detectors 210A, 210B may provide an intensity signal corresponding to current received for that angular range. If the detector is a CCD, the scattered beams may form an image of a diffraction pattern or channeling pattern of sample 20.

Alternatively to concentric, on-axis detectors, the detectors may have a shape that is cylindrically asymmetric. For example, the detectors may be segmented or configured as area detectors that are arranged off-axis. In other embodiments, the detectors have an inner or outer perimeter that is polygonal, such as square or hexagonal, or another suitable shape.

Figure 2:
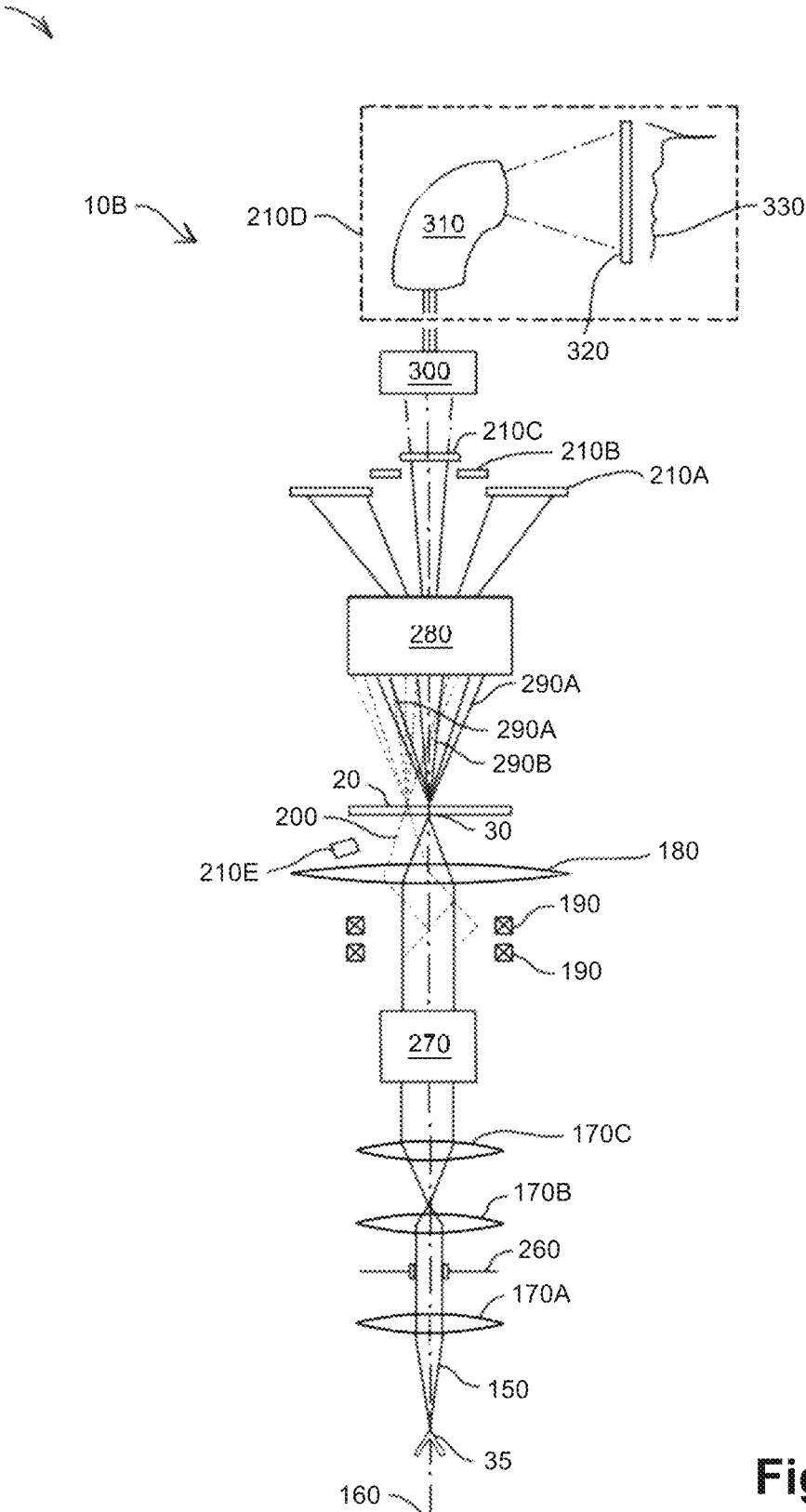
FIG. 2 is a schematic diagram of an exemplary embodiment of a scanning transmission electron microscope (STEM).

FIG. 2 is a schematic diagram of another exemplary embodiment of microscope 10, which in this case is a STEM 10B, provided for the sake of illustration. In the STEM mode, the scattered beam is at least partially transmitted through sample 20 and this portion is therefore considered forward scattered. STEM 10B, like SEM 10A, may have a stage (not shown), electron beam source 35, illumination optics 170A, 170B, 170C, aperture 260, objective lens 100, beam scanners 190, and detectors 210A-C, 210E.

In order to improve speed, accuracy, and sensitivity, STEM 10B may have a dedicated aberration corrector 270 to correct for aberrations in electron beam 150, such as spherical aberrations and parasitic aberrations. The parasitic aberrations may or may not be cylindrically symmetric. Aberration corrector 270 may include electromagnetic lenses to correct for these aberrations. Parasitic aberrations may be caused, for example, by the optical elements having been machined in such a way as to be very slightly off-axis or very slightly non-round. Examples of commercially available aberration correctors include Nion Co. quadrupole-octupole correctors (available from Nion Company of Kirkland, Washington) and CEOS sextuple or quadrupole-octupole correctors (available from Corrected Electron Optical Systems GmbH of Heidelberg, Germany).

The optical system of STEM 10B may also include descanning and projection optics 280. The descanning optics may de-scan scattered electron beams 290A, 290B, thus, for example, realigning beam 290B with optic axis 160. The descanning optics may comprise, for example, descanning coils that may be symmetric to scan coils of beam scanners 190. The projection optics may include magnifying lenses that allow additional manipulation of scattered electron beams 290A, 290B.

The electron beam energy used in STEM 10B may be determined at least in part based on the transmission properties of sample 20. A substrate of sample 20 may have a thickness on the order of 2 nanometers, such as for example a thickness of about 1 nanometer. In one example, the substrate is made of carbon, although single-atomic-layer graphene may also be used. As a result, 1 keV electrons may be the lowest energy appropriate when considering voltage alone.

STEM 10B may be adapted to operate in a "bright field" mode in which a detector, such as detector 210C, detects a "forward-scattered" or "central" beam 290B of electrons emerging from specimen 20. Forward-scattered beam 290B refers to the zero beam (i.e., the 0 scattering vector, referring to the beam whose direction is identical to the orientation of beam 150 impinging on specimen 20) and a small range of angles around the zero beam. The bright-field mode may be particularly sensitive to the energy loss of the electrons, indicating chemical composition. These electrons can be detected to determine, for example, bonding energies of molecules that compose the sample.

Alternative to the bright-field mode, STEM 10B may be adapted to operate in a dark-field mode in which one or more electron beams 290A emerging from sample 20 within a particular angular range are detected. Since sample 20 is illuminated at approximately a point, this angular range of detection can be tightly controlled. For example, the dark-field mode may be an annular-dark-field (ADF) mode in which an electron beam shaped as a hollow cone of preselected thickness is detected. The dark-field mode may involve detecting a hollow cone at higher angles, which is referred to as high-angle annular-dark-field (HAADF) mode. The dark-field mode may also be a medium-angle dark-field (MADF) mode, in which a range of angles between the bright-field mode and the HAADF are detected. These dark-field modes can produce an image with monotonic contrast change with increasing atomic number, which enables direct interpretability of the image to determine relative atomic weights. For example, dark-field imaging can be used to obtain chemically sensitive projections of single atoms, clusters of atoms, or nanostructures. STEM 10B can also operate in simultaneous bright-field and dark-field modes. An electron beam source having a high-brightness gun may allow this mode to operate faster.

In one version, STEM 10B may have a detector 210D adapted to detect electrons in one or more preselected range of energies. Coupling optics 300 may be provided and detector 210D may include an electron prism 310 to filter out electrons that are not in the preselected energy ranges. In one version, this is used for electron energy loss spectroscopy (EELS). Electron prism 310 may, for example, generate an electric or magnetic field by using electrostatic or magnetic means, respectively. The field strength and dimensions of electron prism 310 may be selected such that, when the electrons of varying energies pass through the field, the electrons in the preselected energy range are transmitted through electron prism 310 while the remaining electrons are blocked. Detector 210D may also include a receiver 320, such as including a scintillator and CCD, to receive the transmitted electrons and convert that current into a detection signal. The EELS detection signal can be expressed as a plot 330 of current as a function of electron energy loss.

Furthermore, optics having a larger acceptance angle may improve resolution of STEM 10B. Because of this relationship between the acceptance angle and resolution of STEM 10B, the acceptance angle can be selected based on the desired resolution. For example, in a high-resolution STEM, if 1 Ångström resolution at 100 kilovolts is desired, it may be desirable to have at least about 30 milliradians acceptance half-angle, or even at least about 40 milliradians acceptance half-angle. However, with an angular range that is unnecessarily high, current may be wasted undesirably. Once a suitable accelerating voltage is chosen, the desired resolution may determine the acceptance angle of objective lens 180.

Moreover, detectors 210A-E from SEM and STEM embodiments, such as, for example, from FIGS. 1 and 2, respectively, may be provided concurrently in one embodiment of microscope 10. These may be provided, for example, to operate microscope 10 in simultaneous SEM and STEM modes or to allow relatively quick and easy switching between SEM and STEM modes.

The geometry of one or more of detectors 210A-C may be adapted to distinguish low-angle scattering from high-angle scattering in both forward and backscattering configurations to make contrast in the image depend on atomic number (Z). Detectors 210A-C may be located on the same side of sample 20 as electron beam source 35 or opposite to it. For example, in a STEM mode, detector 210A may be provided to operate in a HAADF mode in which high-angle electron beam 210A is detected, detector 210B may operate in a MADF mode, and detector 210C may operate in a bright-field mode in which axial electron beam 210B including a zero beam is detected.

Each of detectors 210A, 210B, if arranged in a substantially cylindrically symmetric geometry, may limit the scattered electrons to an angular range denoted here as $\varphi_d$, which defines an annulus between an inner angle $\varphi_1$ and outer angle $\varphi_2$. For an ADF mode these angles may be, for example, from about 25 mrad to about 60 mrad for $\varphi_1$, and from about 60 mrad to about 80 mrad for $\varphi_2$. For a STEM HAADF mode using detector 210A, these angles may be, for example, from about 60 mrad to about 80 mrad for $\varphi_1$, and greater than about 100 mrad for $\varphi_2$.

Figure 3:
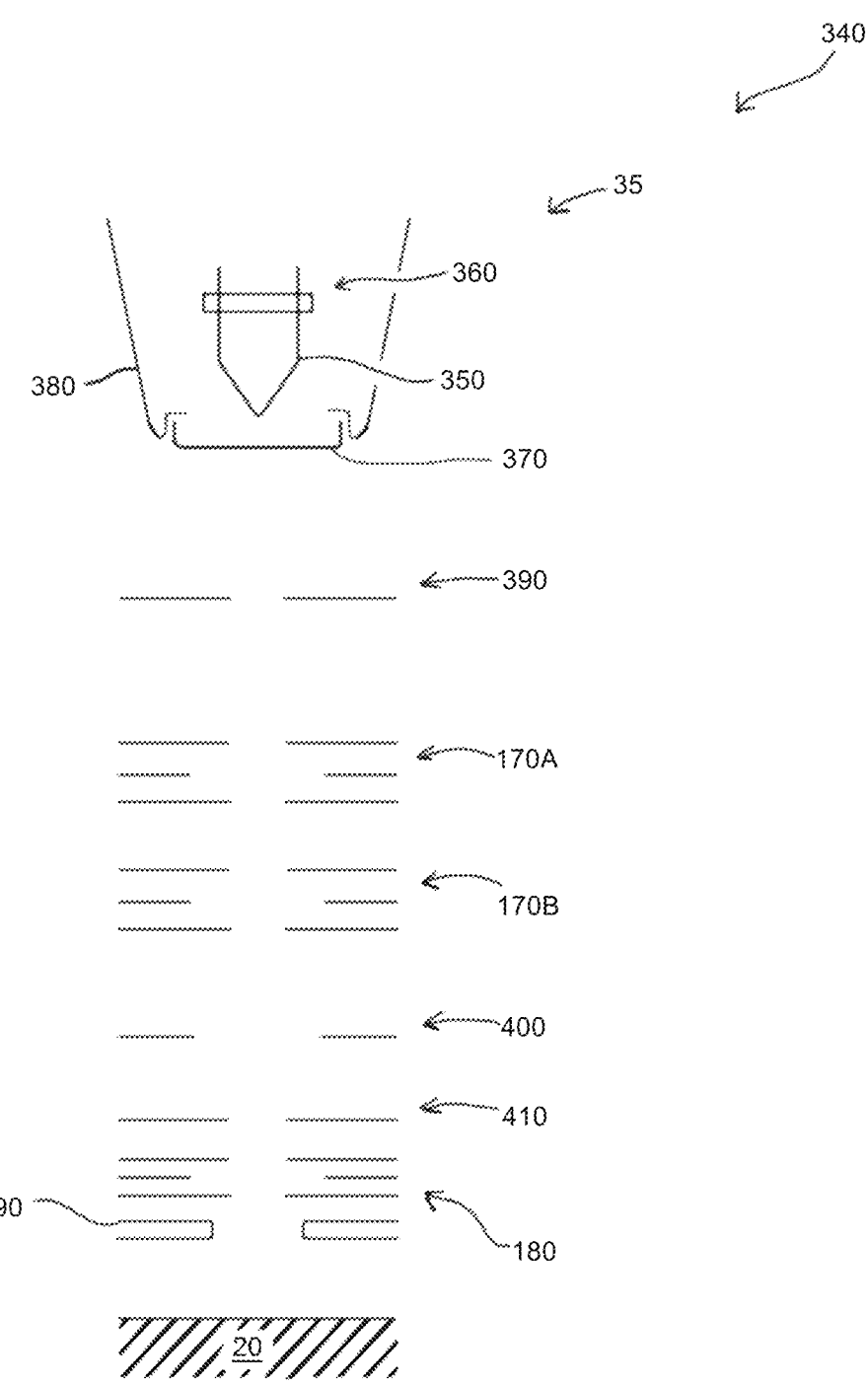
FIG. 3 is a schematic side view of an example of an embodiment of an optical column for a charged-particle beam microscope.

The optical system of a beam-optical microscope (i.e., charged-particle beam microscope, such as a TEM, SEM, or STEM) may be referred to as the optical "column." FIG. 3 is a schematic side view of another example of an embodiment of an optical column 340 for a charged-particle beam microscope. If scanning coils are included, optical column 340 may be the optical column of, for example, a scanning electron microscope (SEM). Alternatively, optical column 340 may be used on the source side of a transmission electron microscope (TEM). Additional descriptions of embodiments of charged-particle beam microscopes are contained in U.S. Pat. No. 8,324,574 to Own et al., titled "Aberration-Correcting Dark-Field Electron Microscopy," and U.S. Pat. No. 8,389,937 to Own et al., titled "Incoherent Transmission Electron Microscopy," U.S. Pat. No. 8,598,527 to Own et al., titled "Scanning Transmission Electron Microscopy," U.S. patent application Ser. No. 14/742,697, filed Jun. 17, 2015, U.S. patent application Ser. No. 14/607,079, filed Jan. 28, 2015, U.S. Provisional Patent Application No. 61/932,159, filed Jan. 27, 2014, and U.S. Provisional Patent Application No. 62/013,514, filed Jun. 17, 2014, all of which are incorporated herein by reference in their entireties.

This column 340 includes a charged-particle beam source 35 (e.g., electron or ion beam source), which has a gun 350 that provides charged particles at a predefined voltage. The voltage may be in the range of from about 1 kV to about 100 kV, with polarity as needed to propel the ions down the column. Source 35 may include a centering mechanism 360, such as, for example, adjustable screws or a motor that is either manually or computer controlled. Source 35 may also have a Wehnelt 370 to provide focusing of the particles as they leave the source. Wehnelt 370 may be set at a voltage close to the particle source voltage and either attractive or repulsive to the particles. For example, the voltage may be set in the range of from about –10 V to about –1000 V and repellant to the charged particles. Source 35 may be surrounded by an insulator 380.

Column 340 may also include a first anode 390, which may be held at ground or other voltage more positive than the beam source 35, to which the particles are attracted. First anode 390 may have a hole in its center (or elsewhere) through which a portion of the charged particles passes. Further downstream, column 340 may also include a number of condenser lenses 170A, 170B or other electron-optical elements to adjust the beam before objective lens (OL) 180. These may be configured in any suitable order or combination. Column 340 may also have stigmators 400. There may also be a final aperture (objective aperture) 410 before OL 180. Finally there is OL 180, followed by sample 20.

Optionally there may be additional components between OL 180 and sample 20, such as stigmators or electrical shifters. The column design in this example is adapted for simplicity. For example, the lenses may not be alignable and there is only one aperture (i.e., the objective aperture) in the whole column (although the bores of condenser lenses 170A, 170B may act to obstruct some of the beam).

Electrostatic optical components may enhance imaging or observation of magnetic samples. This is in addition to the advantage of being able to use a single supply to power all lens elements. Trim lenses may be used for as "fine" focusing to modify the "coarse" focus of the primary lenses such as the objective lens. The coarse focus lens may have a fixed focus. Alternatively, the column may be operated as a fixed-focus lens, where focusing is performed by altering the position of the sample relative to the optical components of the column.

An electrostatic trim lens can also be used within the system to provide fine focusing. Because it offers trim, it may be operated at one to two orders of magnitude lower potential than the primary lens potentials. This trim lens may take the form of a single aperture with a potential applied, or may be a more formal lens such as a full Einzel lens that is weakly excited. A variation of the above-described embodiment uses one or more magnetic lenses.

The optical column may be constructed as a module that is enclosed and adapted to be inserted and locked into microscope enclosure and removed therefrom by a human user. The microscope housing may complementarily be adapted to receive the column module. Both the column module and the microscope housing may be adapted to permit signal communication between the column module and other components of the microscope when the column module is locked into the microscope.

The column module may contain components of a charged-particle optical column, such as but not limited to the charged-particle beam source. Optical elements, such as lenses, shape the beam as it propagates through the column. The components may also include, for example, an accelerating aperture (such as a first anode), a stigmator, beam scanners to scan the beam, and detectors. Sidewalls of the enclosure may be made of an electrical insulator in one embodiment. The top of the enclosure, meanwhile, may be metal.

The column module may be substantially sealed from an environment external to the column. For example, when evacuated, the column module may maintain a significant pressure difference between the volume inside the column module and the external environment. The internal volume and the external environment may even have different species of gases or liquid.

The column module may have a feedthrough that allows electrical signals to be conducted through enclosure and into the column module, such that signals may be applied to the components inside the column module. For example, electric potentials may be applied, through the feedthrough, independently to the gun of the charged-particle beam source and the optical components. The feedthrough may have electrical leads with exposed electrical contacts that couple to electrical contacts of the microscope housing when the column module is inserted and locked into microscope 10. As an alternative to electrical signals, the feedthrough may be adapted to convey optical signals, such as through optical fibers embedded in the feedthrough.

In one version, a full TEM column is modularized such that the entire optical stack and optionally the detector and sample region are contained within a single module. Several modules may be easily interchangeable and replaceable. A housing may contain the column module, which attaches to the housing via a single interconnect to a feedthrough. Optionally an orifice or multiple orifices for sample introduction and/or loading may be part of the housing. The feedthrough may contain electrical and/or vacuum connections. This method of single interconnection has, as an advantage, that a single column may be switched easily with another, enabling rapid servicing and use of the housing for a different column for substantially continuous use.

Additional optical components, such as lenses, stigmators, deflectors, beam splitters, and prisms may be implemented as respective modules to augment the functioning of the system. Such elements may allow for capabilities such as beam blanking, interferometry, holography, and other types of unique measurements by affecting the beam shape or geometry just above the sample.

Two examples of modularized versions of a TEM are shown in FIGS. 4A and 4B, respectively. These examples have housings 500 that enclose TEM columns 510 of optical elements. Pumping systems 520 and electronics 530 are also provided. The embodiment illustrated in FIG. 4A contains a single interconnect 540 and a single feedthrough 550 for both electrical and vacuum connections. It also has an orifice 555 for sample loading/unloading. The embodiment illustrated in FIG. 4B, meanwhile, contains separate electrical and vacuum connections. Electrical connections pass through interconnect 540 and feedthrough 550 to electronics 530. A separate vacuum connection goes to pumping system 520. Alternatively to these two examples, pumping system 520 may be shared between multiple housings.

Figure 5A:
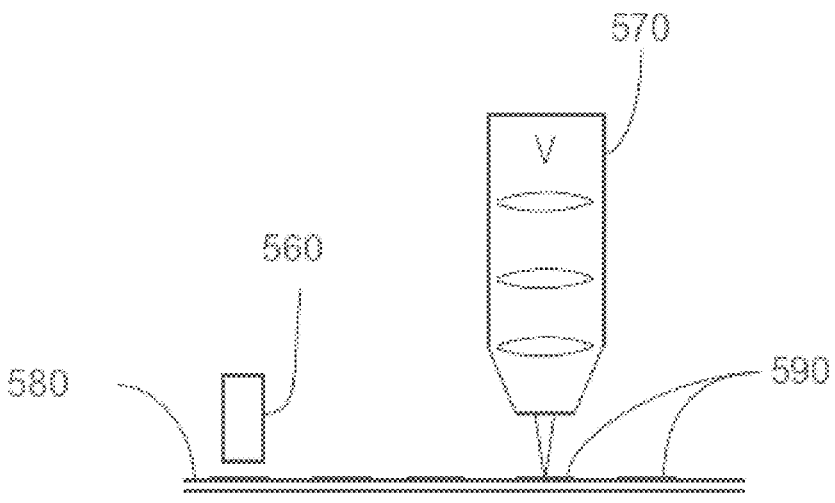
FIGS. 5A and 5B are examples of embodiments of acquisition systems combining an analyzer with a charged-particle beam microscope.

Microscope 10 may be used in combination with other imaging and detection systems in combination. FIG. 5A illustrates an example of an embodiment of a serial acquisition system combining an analyzer 560 with charged-particle beam microscope 570 connected in series by a tape 580 carrying samples 590. The sample of interest is analyzed in a first region by an analyzer 560. Analyzer 560 may comprise, for example, a light microscope, a scanned light microscope, x-ray detector, cathodoluminescence detector, Raman spectrometer, or other analyzer. The first region may or may not be under the same environment required for charged-particle beam microscope 570 to operate. Sample 590 traveling on tape 580 traverses a boundary into a second volume where it is analyzed by charged-particle beam microscope 570. Charged-particle microscope 570 may be an SEM, TEM, STEM, or other type of microscope.

Figure 5B:
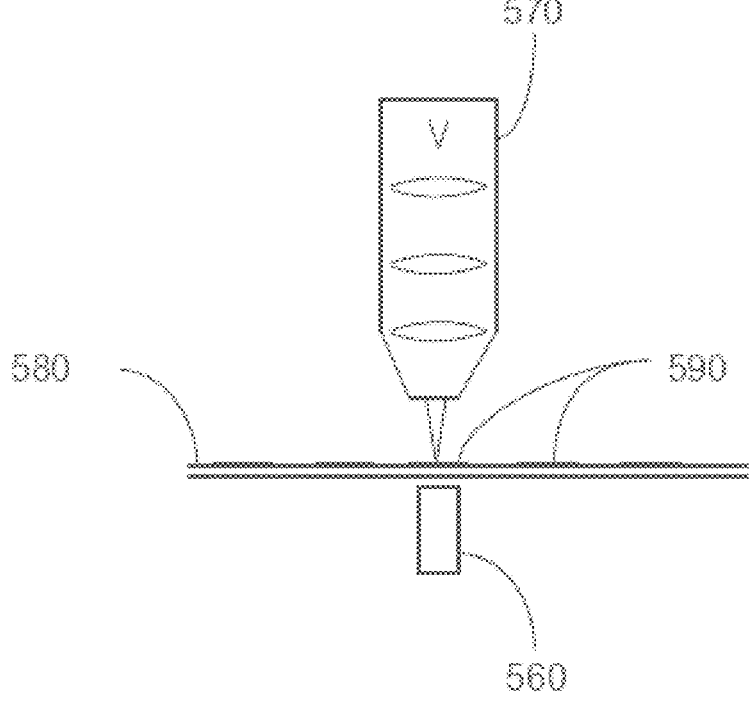

FIG. 5B illustrates an example of an embodiment of a tandem acquisition system, in which sample 590 may be concurrently analyzed, or analyzed sequentially in the same volume by an analyzer 560 and a charged-particle beam microscope 570. In this configuration, sample 590 is analyzed from opposite sides, with at least one analyzer 560 acting through a transparent substrate or window in carrier tape 580.

Microscope 10 may include or be connected to a power supply that provides power to components of microscope 10. The power supply may include one or more individual power supplies, such as set to different voltages or otherwise taking different forms. Components of a charged-particle beam microscope that receive power from the power supply may, for example, include a charged-particle beam source (e.g., electron beam source 35), condenser lenses (e.g., condenser lenses 170A, 170B, 170C), the objective lens (e.g., objective lens 180), the detectors (e.g., detectors 210A-E), and the stage (e.g., stage 40). The power supply also provides power to the pumps of microscope 10, and to any other components of microscope 10 that consume power. In one embodiment of a charged-particle beam microscope, the optical system of microscope 10 has a total power consumption for all such components of less than about 2.5 kW. In another embodiment, designed for power efficiency, microscope 10 is a charged-particle beam microscope that has a total power consumption of less than about 1 kW. In yet another embodiment optimized for very high efficiency, microscope 10 is a charged-particle beam microscope that has a total power consumption of less than about 100 W.

In a charged-particle beam microscope, the power supply can provide one or more voltages to accelerate the charged-particle beam. In one version, the power supply includes at least one high-voltage supply, which may be used for a number of lenses. A single high-voltage supply that may be used to provide the primary beam energy can be modified with resistors to provide multiple values to different lenses that are at a ratio of the primary high-voltage value of the high-voltage supply. These resistors may be either constant or programmable by the controller. In this manner, instabilities that may be present in the high voltage signal can be provided substantially equally to the multiple lenses and the effects of the instabilities can be lessened. The power supply may also include one or more low-voltage supplies, such as to provide lower voltages to non-round lenses, such as dipoles, quadrupoles, and octupoles.

Charged-particle beam microscope 10 may include a controller to control various aspects of operation of microscope 10. The controller may, for example, receive inputs from a human user, provide instructions or other signals to components of microscope 10, and/or perform data processing of signals detected by microscope 10 to generate and process images. For example, the controller may control the components of the optical column of microscope 10, such as, in the case of a charged-particle beam microscope, the charged-particle beam source, beam scanners (e.g., beam scanners 190), and the detectors, as well as the stage (e.g., stage 40). As another example, the controller may control and/or read back data from the power supply for the charged-particle beam source filament by transmitting and receiving control commands and data. The controller may also receive signals from the detectors (such as detectors 210A-E) to be processed computationally to generate images. The controller may include an image formation unit for this purpose. The image formation unit may be disposed within or external to the microscope column and communicate with the optical system and the stage in any fashion, such as by a direct or indirect electronic coupling, or via a network. The controller may automatically handle one or more aspects of operation of microscope 10, and may even be adapted to substantially automate the operation of microscope 10 with minimal input required from a human user.

The controller may include one or more microprocessors, controllers, processing systems, and/or circuitry, or any suitable combination of hardware and/or software modules. For example, the controller may be implemented in any quantity of personal computers, such as IBM-compatible, Apple, Macintosh, Android, or other computer platforms. The controller may also include any commercially available operating system software, such as Windows, OS/2, Unix, or Linux, and any commercially available and/or custom software such as communications software or microscope monitoring software. Furthermore, the controller may include one or more types of input devices, such as for example a touchpad, keyboard, mouse, microphone, or voice recognition.

The controller software may be stored on a computer-readable medium, such as a magnetic, optical, magneto-optic, or flash medium, floppy diskettes, CD-ROM, DVD, or other memory devices, for use on stand-alone systems or systems connected by a network or other communications medium, and/or may be downloaded, such as in the form of carrier waves, or packets, to systems via a network or other communications medium.

Charged-particle beam microscope 10 can be controlled using at least one terminal having a user interface (UI) that communicates with microscope 10, such as via the controller. Either all or a subset of the functionality of each component may be exposed to the UI, such as via an application programming interface (API). The UI may automatically make changes to the components based on information it receives from the user, from other components, and/or at certain times or locations. The UI may thereby offer a simplified way to control various components of microscope 10.

Microscope 10 may be operated by a portable device providing that UI in the form of hardware and/or software. The portable device may be, for example, a tablet computer, smartphone, or other consumer device. For example, this UI may be a secondary interface, where a terminal that is local to microscope 10 constitutes the primary interface. This secondary interface can provide some or all of the functionality of the primary user interface, such as complete operation of microscope 10. Any number of these secondary interfaces may be adapted to control the instrument.

The UI may include a touch-screen interface to enhance interaction of the user with the microscope. For example, a pinching movement of the fingers or hand on the touch-screen may cause the image to grow or shrink. Dragging with a finger could cause the stage to move. It may also shift the current image immediately, estimating the appearance of the next image to acquire. Other gestures could perform other operations (e.g., two-finger drag could change astigmatism, etc.) The user could use a touch screen interface to perform all necessary actions on the microscope. These could include moving the sample, changing the field of view, focusing, stigmating, or otherwise tuning the image, changing the sample dwell time, changing the resolution, changing source intensity, etc. The UI may also be configured to synchronize and mediate between multiple devices connected to microscope 10.

The controller and the UI may provide two-way communication between the human user and microscope 10, such as feedback-based control of microscope 10 by the user. For example, the user may make a gesture at the UI, such as a swipe of a finger, that causes a stage movement or beam displacement to shift imaging in proportion to the swipe. The UI may then quickly refresh the image provided to the user for the new imaging location. The user may also make a gesture at the UI to change, for example, one or more imaging perspectives, brightness, or contrast, which may control detectors of the microscope, such as by turning them on or off or by triggering actuators that change the detectors' positions. For feedback-based control of microscope 10, it may be desirable to have two-way communications between UI and microscope 10 with suitably low latency in relation to human visual and tactile senses, and at least one-way communication from microscope 10 to UI with sufficiently high throughput to provide images to the user sufficiently quickly to give the user a sense of "real time" performance. In one embodiment, lower-resolution survey images may be provided to the user in substantially real time, and at a selected imaging location the user may request a higher resolution image that is not provided in real time. In one example, microscope 10 and the UI are adapted to have the stage respond to user commands with a latency of less than about 100 ms. In another example, microscope 10 and the UI are adapted to respond to user commands and give feedback or send a complete image from microscope 10 to the UI in less than about 1,000 ms, and preferably less than 500 ms.

Figure 6:
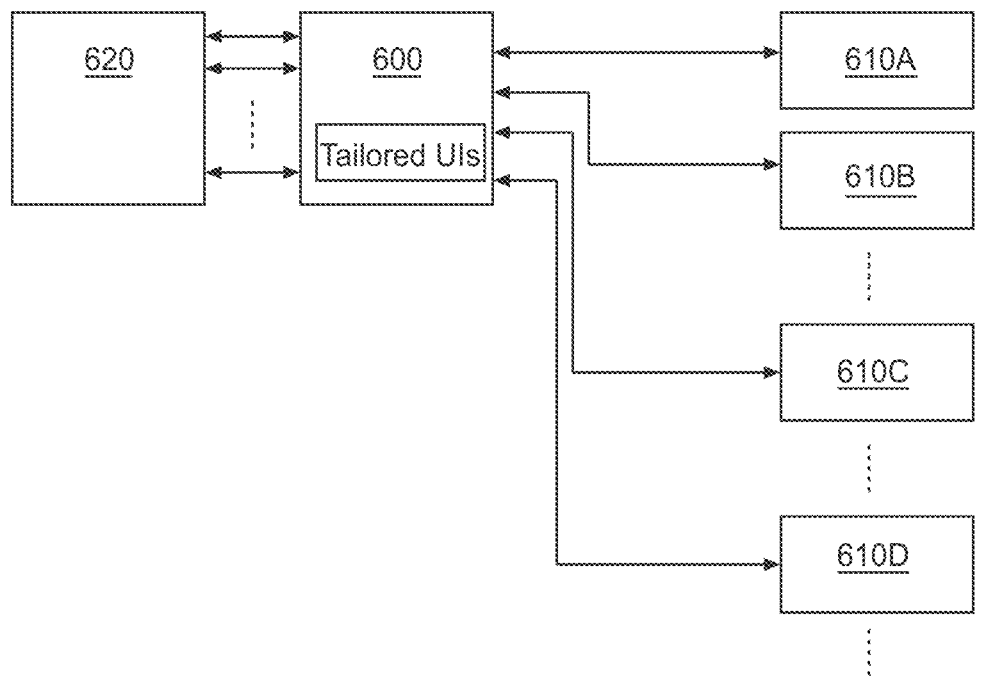
FIG. 6 is a schematic diagram of communications between microscope hardware, a controller, and multiple clients.

FIG. 6 is a schematic diagram of an example of an embodiment of an environment in which a controller 600 serves multiple clients 610A-D. Clients 610A-D may serve as terminals having UIs. Controller 600 is connected to microscope hardware 620, which may include, for example, the optical components, detectors, stage, and power supply of the microscope. Controller 600 can thereby control the microscope and/or read back data or other signals from the microscope. Controller 600 may serve tailored UIs, which are customized for one or more of particular types of clients 610A-D. For example, controller 600 may include a web server that provides tailored UIs to clients 610A-D as web services, which may be exposed and served based on authentication, identification, or some other request method from client. This can allow two-way communication between controller 600 and clients 610A-D. Clients 610A-D may include simple clients, such as, for example, imaging monitors, as well as complex clients, such as, for example, microscope controllers, image postprocessors, cloud storage or processing services, or microscope managers.

The controller and the UI may be adapted to attempt to perform as many operations automatically as possible. For example, starting an application, or turning the device on may be interpreted as the user wanting to operate the microscope and it can attempt to turn on the microscope automatically. This could also happen in response to actions taken on the instrument itself; e.g., closing a door could interpreted as a cue to turn on the microscope. The microscope may be kept as "on" as possible, depending on power requirements or longevity of components.

As one example, automation may be provided around the changing of a sample in a charged-particle beam microscope (EM). Changing the sample may, in some embodiments, require venting to air a previously evacuated area, and may involve ramping the source voltage down to a safe level. Both steps may be performed automatically when the user starts the sample change. Once the change is complete the area is automatically evacuated and the high voltage automatically turns on. (If the instrument is running on batteries, however, this step may be postponed until later to preserve battery power.) The microscope would automatically get itself as ready as possible for imaging, for example ramping the filament to a temperature at which its lifetime is not shortened, but it remains near enough to the operating temperature that normal operation can be achieved relatively quickly without any stress to the filament. At this point the user could start the tablet computer, smartphone, or other consumer device, or even visit a website, at which point the microscope is automatically turned on fully (if running under batteries, this could be the point at which it performs the previous steps mentioned, having postponed preparation of the microscope for imaging until needed to preserve battery life).

Once the user has indicated that the imaging session is over, which could be either via a preprogrammed time limit, period of inaction or by closing an application, leaving a website, putting a device to sleep, or a suitable alternative method, the microscope returns to a "ready" state where the filament longevity is not reduced but the microscope is ready to start at a moment's notice. An example of the "ready" state may include leaving the high voltage energized and stable while turning the filament to a reduced current level to protect its longevity. If running under battery power, the microscope may skip this state and return to its minimum power state as soon as possible.

At some other point the microscope could enter its power off state, if for example an off button was pushed or an option in the software selected or some other indication that the microscope needed to power down. This could even be having the mains power removed from the microscope. At this point the microscope would safely shutdown any remaining components.

An automated sample-feeder may be provided to deliver samples to the analysis section (i.e., imaging area) of the microscope and advance them away from the analysis section and into a storage section. The construction of the analysis section may be optimized for stable operation under certain controlled conditions. The storage section of the automated sample-feeder may store samples that are not currently being analyzed.

In one version, the automated sample-feeder is adapted to interface with an otherwise conventional TEM, which has a cylindrical body and access ports surrounding the analysis section. The automated sample-feeder may be adapted to be retrofitted onto such a conventional TEM microscope via load lock interfaces and to integrate seamlessly without disrupting other aspects of the TEM operation.

The automated sample-feeder may deliver multiple sample(s) sequentially to the analysis section of the microscope. In one mode, the automated sample-feeder advances samples through the analysis section. In a second mode, the microscope analyzes the sample. During the second (analysis) mode, the automated sample-feeder may relax or eliminate coupling of the outside environment to the analysis section (which may be caused by a delivery medium that traverses from the portion of the sample-feeder that is outside the microscope to the analysis section inside the microscope).

Conventional charged-particle beam microscopes may have substantial space constraints in the sample area that prevents easy analysis of many samples serially or continuously and generally requires that only small volumes can be analyzed at a time. A system has been produced for continuous serial observation of thousands of samples in the microscope in transmission mode (TEM). This system may also be adapted to operate in scanning modes, such a SEM or STEM.

A tape system provides a method for transporting flexible tape, or some other medium, across the viewing area of a charged-particle beam microscope. The microscope could be a TEM or SEM, for example. The viewing area could be a small aperture in a cartridge that holds the tape such that a sample can be analyzed and enables the tape to progress so that subsequent samples can be analyzed. The samples may be created in a different preparation step and placed onto the tape for analyzing.

A tape may be provided as a carrier medium for samples to be imaged. The tape may be made of a flexible continuous material with suitable thermal isolation and damping properties. Examples of materials that may be suitable for use in the vacuum environment of EM include, for example, polyimide, neoprene, and Viton®. The tape may be coated with a conductive or moderately resistive film or impregnated with conductive particles to ensure electrical conductivity and to carry away excess charge.

The tape may have a plurality of holes or electron-transparent windows, such as at discrete regular distances. An electron-transparent window may be made of, for example, an oxide or thin carbon film. A sample may be suspended over an aperture or electron-transparent window for imaging. Thus, the samples may be placed at discrete regular distances on the tape that coincide with the holes or electron-transparent windows. FIGS. 7A and 7B are top and side views, respectively, of a tape 580 with apertures 630 to support samples 590. A transparent support layer 640 may optionally be provided.

In another embodiment, the tape supports discrete sample carriers on which samples are placed. The discrete sample carrier may be, for example, a semiconductor chip or metal foil that supports and/or encapsulates a sample. The discrete sample carrier may be embedded in the tape before the sample is loaded. Alternatively, the discrete sample carriers may be prepared with samples thereon before they are inserted into the tape. FIGS. 8A and 8B are top and side views, respectively, of a tape 580 with apertures 630 to support discrete sample carriers 650.

A discrete sample carrier may carry one or more samples. For example, in one embodiment, a discrete sample carrier has a single aperture with a larger single rigid sample placed thereon. In another embodiment, a discrete sample carrier has a single large aperture with multiple samples, such as linear polymer strands, laid over it.

Figure 9:
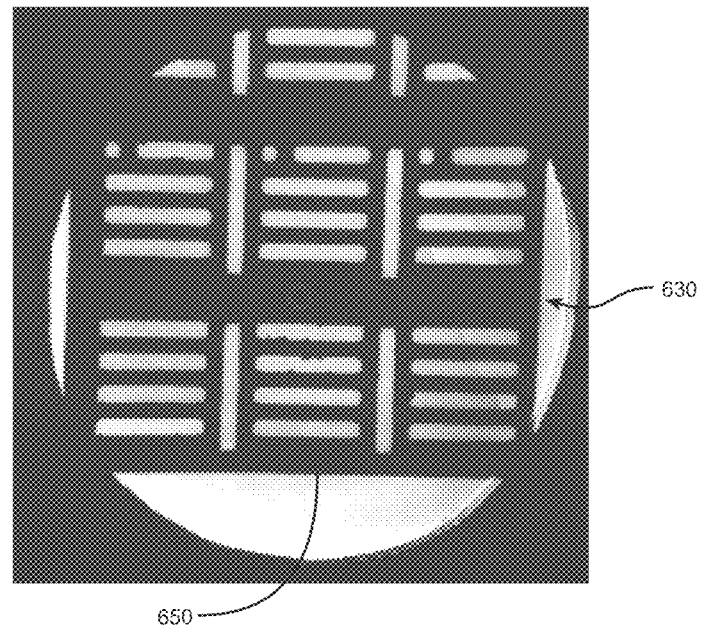
FIG. 9 is a grayscale image of an example of an embodiment of a sample carrier that is a chip with a plurality of apertures, including apertures of different sizes.

In still another embodiment, the discrete sample carrier has a plurality of apertures therein, which may be shaped and sized differently, for supporting a plurality of samples laid over the distinct apertures. FIG. 9 is a grayscale image of an example of an embodiment of a sample carrier 650 that is a chip with a plurality of apertures, including apertures of different sizes.

Additional examples are illustrated. FIG. 10 is a top view of an example of an embodiment of a tape that is supporting multiple samples on each of a plurality of apertures, for TEM, where the samples are linear polymer strands 660. FIG. 11 is a top view of the tape embodiment shown in FIG. 7A, but with sprocket holes 670 along an edge of the tape to permit being driven by a sprocket drive. And, FIGS. 12A and 12B are top and side views, respectively, of an example of an embodiment of a tape that is supporting samples and that contains identification codes for the samples, for scanning electron microscopy (SEM). The last example may optionally have a functionalized support layer 690.

Furthermore, the samples may be identified and tracked. If the samples are fed into the EM by tape, for example, an identification (ID) code may be placed on the tape adjacent to, or otherwise in a predefined location relative to, the samples to uniquely identify the samples. The ID code may be, for example, a visual pattern, QR code, or barcode. Some examples of ID codes 680 are shown in the embodiments of tape of FIGS. 7A, 8A, 10, 11, and 12.

Figure 13:
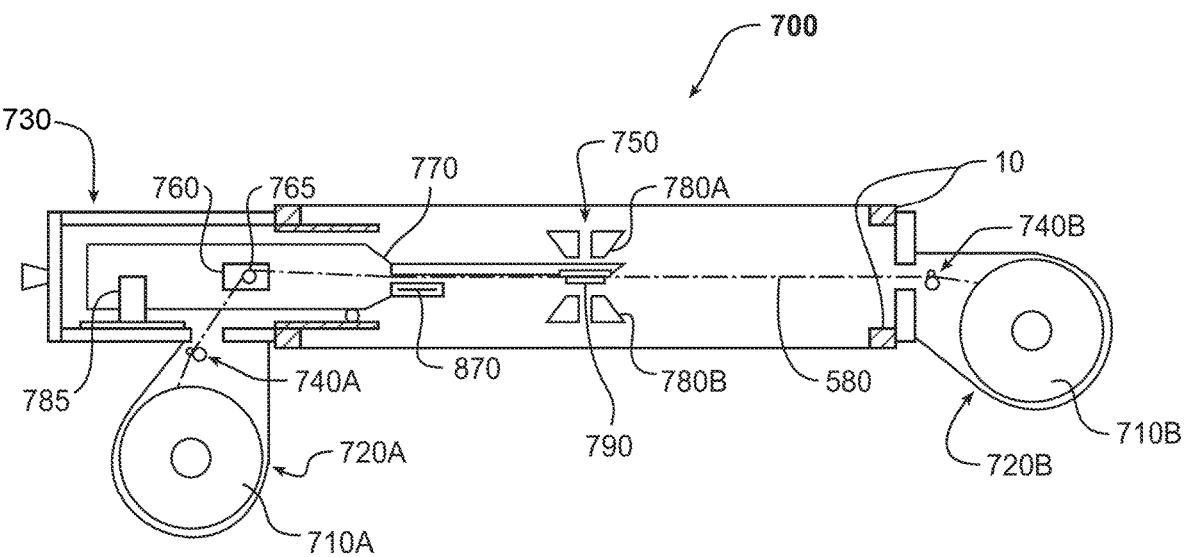
FIG. 13 is a schematic diagram of an example of an embodiment of an automated sample-feeder.

FIG. 13 is a schematic diagram of an example of an embodiment of an automated sample-feeder 700. One or more reels 710A, B may be used to store tape 580. Tape 580 is rolled onto a feed reel 710A in feed housing 720A. A takeup (i.e., collection) reel 710B may be provided in a takeup housing 720B. During operation, tape 580 with samples is provided by feed reel 710A, advances through the system, and is taken up and stored in takeup reel 710B.

Feed reel 710A and/or takeup reel 710B may be stored at vacuum. In one embodiment, both reels 710A, B may be stored outside the EM column. Automated sample-feeder 700 may have a load lock housing 730 to allow easy tape loading. In an alternative embodiment (not shown), one or both of reels 710A, B may be stored within the body of the EM column rather than outside of it.

In another version, the reels are stored at air pressure. A feedthrough connecting air and vacuum volumes is provided to enable transfer between differing volumes without damage to the samples on the carrier. This may take the form of a "whistler" interface which may comprise a slit or series of slits that provide for transitions between air and vacuum. Another embodiment of a slit-based interface might provide for a separator comprising a suspension of viscous yet inert fluid, for example ferrofluid, which is retained at each slit position but enables free progression of the tape and sample without damaging the samples or leaving fluid residue.

In one version, the automated sample-feeder uses two drives to progress the tape, such as shown in FIG. 13. For example, two drives 740A, B may be positioned symmetrically about an analysis section 750 of automated sample-feeder 700 that is inside the microscope, comprising one drive on each side of analysis section 750. Tape 580 can be progressed in either one or both directions (the two directions being backwards and forwards). Each of drives 740A, B may be a friction (i.e., pinch) drive comprising two wheels that sandwich tape 580, at least one of these being wheels driven by a motor. At least one wheel surface grips tape 580 so that tape 580 advances while the wheel is being driven. An alternative method of driving tape 580 is to use a sprocket drive. A clutch may be provided in the drive system to limit the torque on drives 740A, B so as to prevent overtensioning tape 580.

In another version (not shown), the system may alternatively use only a single active drive in combination with a controllable clamp. This drive system may be asymmetric, comprising a drive and a clamp on either side of the analysis section. In this case, the automated sample-feeder can operate using a single on-off control for the clamp combined with full control of the single drive. This is in contrast to the two-drive system, in which two fully controllable active drives are used. A clamping force limiter may be provided in the case of an asymmetric drive/clamp system so as to prevent overtensioning the tape.

The one or two drives may apply a small (nondestructive) torque to one or both of feed and takeup reels 710A, B to ensure that tape 580 is compactly packed onto reels 710A, B during release and takeup. Automated sample-feeder 700 may also have a specialized tension meter 760 to measure the tension of flexible tape 580. The measured tension in tape 580 may be used, such as by the controller, to control the relative speed of the two drives so as to keep the tape tension constant, or prevent damage to delicate films or samples carried on tape 580 by keeping the tension under a critical value. Tension meter 760 can also detect any slippages, breaks of the tape, or motor malfunction of the tape drives.

In one embodiment, tension meter 760 includes a strain gauge that is attached to a roller 770 that is used to guide tape 580. Roller 770 may have the shape of a wheel, and tape 580 may glide over roller 770. Roller 770 may have an inverted top hat profile at its surface to enable contact of roller 770 with tape 580 to both sides of the samples, such that the samples can pass freely over roller 770 without coming into direct contact with the roller surface. Tape 580 may trace the radius of roller 770, resulting in the concave side of tape 580 exerting a force on roller 770. An axle on which roller 770 spins may transfer this force via a frame to an elastic bending element, which may be fastened to the body of the cartridge. This elastic bending element may comprise a thin metal sheet with a strain gauge cemented onto its surface. When the metal sheet bends in response to the force, the strain gauge reports a change in the measured strain, corresponding to a change in tension of tape 580. Thus, tension meter 760 can report the current tension of tape 580.

Automated sample-feeder 700 may have a cartridge 770 that traverses into analysis section 750 of microscope 10 and that is adapted to guide tape into, and support samples within, analysis section 750. Analysis section 750 may be inside the objective lens of microscope 10, such as between upper and lower pole pieces 780A, B of the objective lens. Cartridge 770 may be configured to guide the tape through (or around) its body so as to transfer the samples into analysis section 750. Furthermore, cartridge 770 may be sized and shaped to fit within analysis section 750 without significantly disrupting the normal operation of the objective lens.

Cartridge 770 may be further configured to translate and/or tilt each sample within analysis section 750. In one embodiment, cartridge 770 may provide axial (i.e, "x-axis" along the tape feed direction) motion by moving its own body relative to a reference plane (e.g., the column load lock interface). In this embodiment, cartridge 770 may provide height (i.e., "z-axis") and tilt (a and/or 3) motion by moving a carriage 790, which holds the portion of tape 580 that is in analysis section 750, relative to the rest of cartridge 770. A micromotor assembly 785 may drive the movement of cartridge 770.

Finally, in this embodiment, carriage 790 may provide motion of the sample in the axis (i.e., "y-axis") transverse to the tape feed direction and parallel to tape 580 by moving the sample relative to carriage 790. The y-axis may be used as the "fast" axis and the most responsive axis, such as due to the small moving mass of the portion of carriage 790 that moves in the y-axis. For example, carriage 790 may translate samples as fast as or faster than 1 µm/ms, and settle faster than about 500 ms.

Carriage 790 may use a miniature motor assembly to move the sample. Furthermore, the miniature motor assembly may contain primarily or exclusively nonmagnetic and vacuum-stable materials. Some examples of such a miniature motor assembly include a piezomotor assembly, voice coil drive, coil drive that acts against the magnetic field of the EM lens field, or even mechanical linkages (e.g., levers, pistons, pulleys) connecting outside forces to the analysis section.

Carriage 790 may have a clamping mechanism to keep tape 580 substantially flat, uniform, and stable within the analysis section during imaging. This clamping system may also serve to provide positive electrical contact between the tape and carriage body. This clamping mechanism may include a spring-loaded frame or frame elements whose applied tension on the sample is easily overcome in the axial direction of the tape by the tape drives.

Furthermore, a spring-loaded clamp may have an active release system to temporarily decrease or release its tension entirely, for example using a piezo actuator, enabling the tape to advance freely. Alternatively, the clamp may be an active clamp that is turned on by activating a piezo actuator, such that the tape advances freely except when the clamp is actuated.

Figure 14:
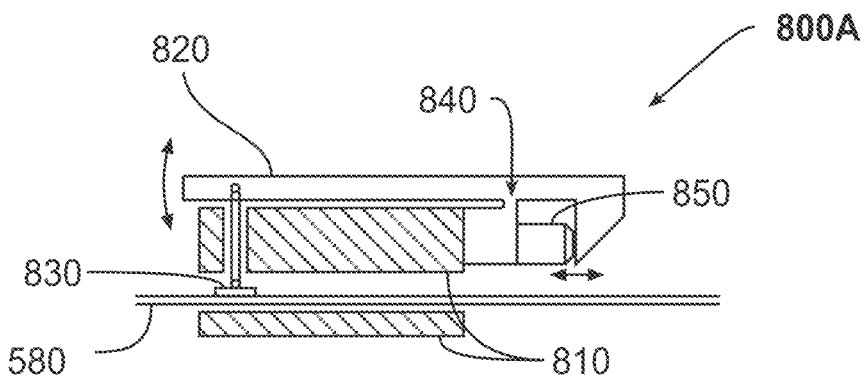
FIG. 14 is a schematic diagram of an example of an embodiment of an active clamping mechanism.
Figure 15:
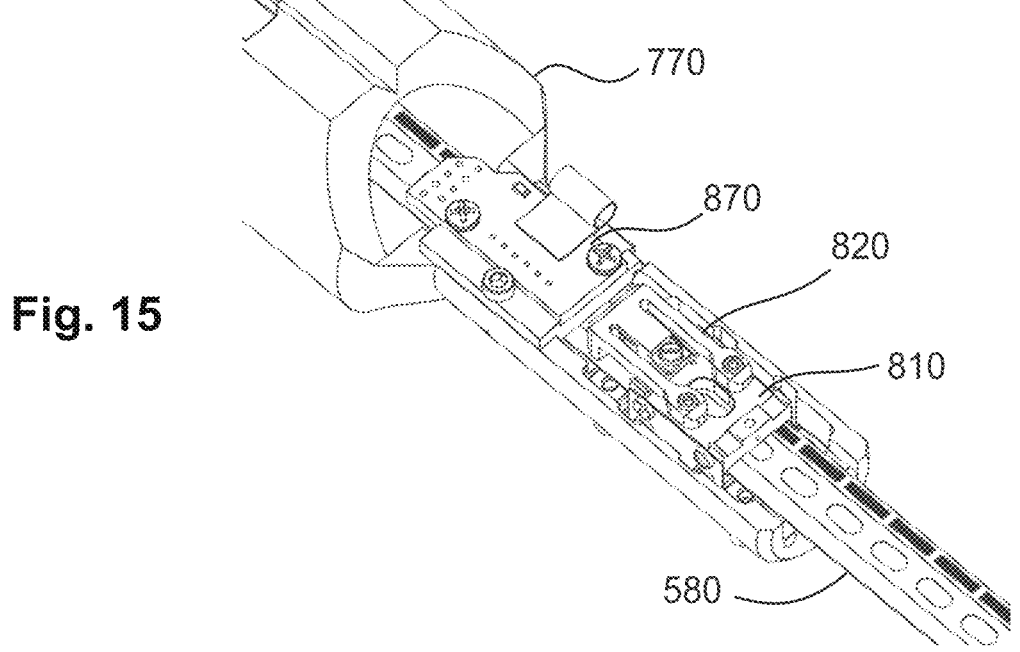
FIG. 15 is a three-dimensional rendered perspective view of the clamping mechanism of FIG. 14.

FIG. 14 is a schematic side view of one embodiment of a clamping mechanism 800A. In this embodiment, clamping mechanism 800A has a frame 810 coupled to an actuator arm 820. Actuator arm 820 is connected to a clamping element 830 that extends to just above tape 580. Actuator arm 820 has an elastic hinge 840 about which it can pivot. (In one example, actuator arm 820 is made of titanium.) Clamping mechanism 800A also has a micro linear actuator 850 that, when actuated, pushes rightward against the inner right wall of actuator arm 820, causing actuator arm 820 to pivot counterclockwise. This counterclockwise pivoting action causes clamping element 830 to gently clamp down on tape 580. FIG. 15 is a three-dimensional rendered perspective view of the same embodiment of clamping mechanism 800A.

In an alternative embodiment, the clamping mechanism uses passive leaf springs to constantly press against edges of tape, applying sufficient force to keep tape substantially flat, uniform, and stable within the analysis section, but also with sufficiently low force that it can be overcome by the tape drives without damaging tape.

Returning to FIG. 13, automated tape-feeder 700 may be configured to substantially isolate the portion of tape 580 that is inside analysis section 750 from the external environment—thermally, mechanically, acoustically, and/or electromagnetically (except through connections able to carry away or measure excess charge as is typical in the EM, either through the tape or dedicated electrical contacts). For example, mechanical isolation may be achieved by optimizing the stiffness of stage components and kinematically linking them to the core imaging system so that they are referenced to the optical system.

Furthermore, the mass of load lock housing 730 and cartridge 770 may be made very large in relation to carriage 790 residing in analysis section 750, so as to damp acoustic vibrations originating from outside analysis section 750, and to prevent translation into analysis section 750. This large difference in mass also serves to speed up the motion by decreasing the moving mass and increasing the resonant frequency of the moving portion of carriage 790 within analysis section 750.

Analysis section 750 may be shielded from fluctuating electric and magnetic fields by shielding the column itself.

Since no efficient magnetic or electrical coupling can be made from external sources to components within the analysis section, interference through inductive means is substantially eliminated. Furthermore, substantial thermal and electrical isolation may be achieved by the use of ceramic bearing systems that eliminate short-circuits.

Analysis section 750 may also be temperature-compensated to avoid thermal drift. For example, the position of the sample may be temperature-compensated to first-order by tracking the temperature drift over time and shifting the sample position (e.g., shifting cartridge 770) in the direction with greatest material expansion with temperature ("x-axis").

Cartridge 770 may incorporate an ID reader 870 along the tape path, to read the ID codes described above. For example, the ID reader may have an optical sensor located near the analysis section. The ID reader may optionally be placed anywhere in the system where it is convenient to read ID codes from the tape.

Figure 16:
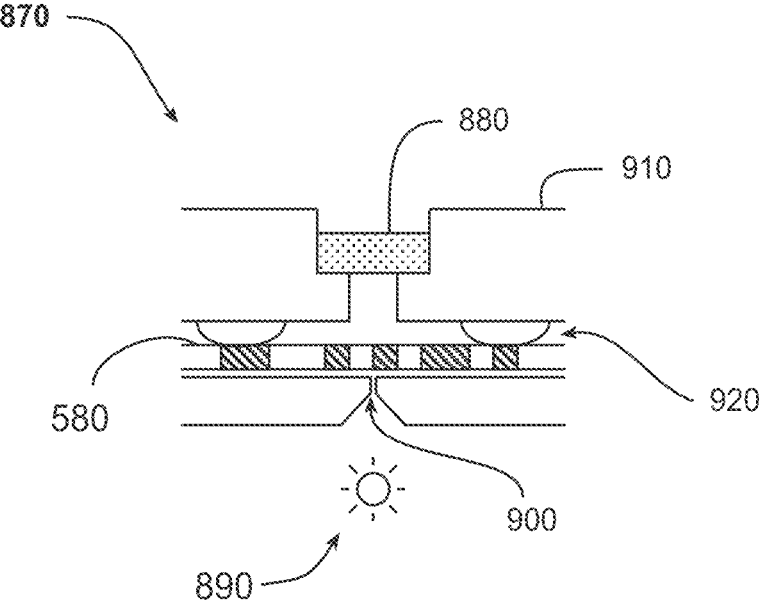
FIG. 16 is a schematic diagram of an example of an embodiment of an ID code reader.

FIG. 16 is a schematic side view of an example of an embodiment of an ID reader 870 for reading an ID code 680 on tape 580. ID reader 870 has a light detector 880 on the opposite side of tape 580 from a light source 890 and an aperture 900 that allows light source 890 to illuminate ID code 680 from the opposite side. Light detector 880 may be supported by a detector carrier 910, which may have soft bumpers 920 to avoid abrasive contact between detector carrier 910 and tape 580. As tape 580 is advanced or retracted, light detector 880 generates a waveform of light intensity that corresponds to the encoded value of ID code 680. The controller may evaluate this waveform to identify the sample associated with ID code 680.

Figure 17A:
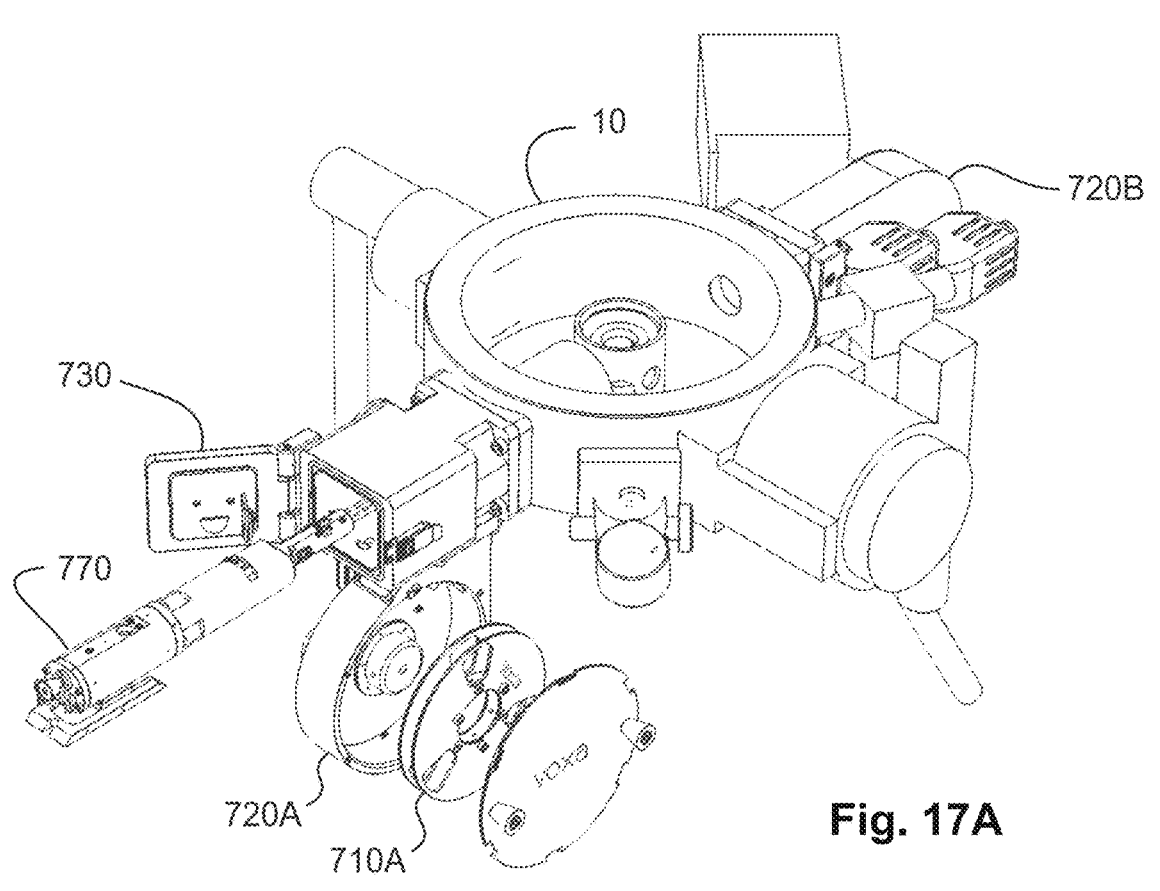
FIGS. 17A, 17B, 17C, and 17D are three-dimensional rendered perspective views of stages of an example of an embodiment of loading a reel of sample tape into the automated sample-feeder of FIG. 13.
Figure 17B:
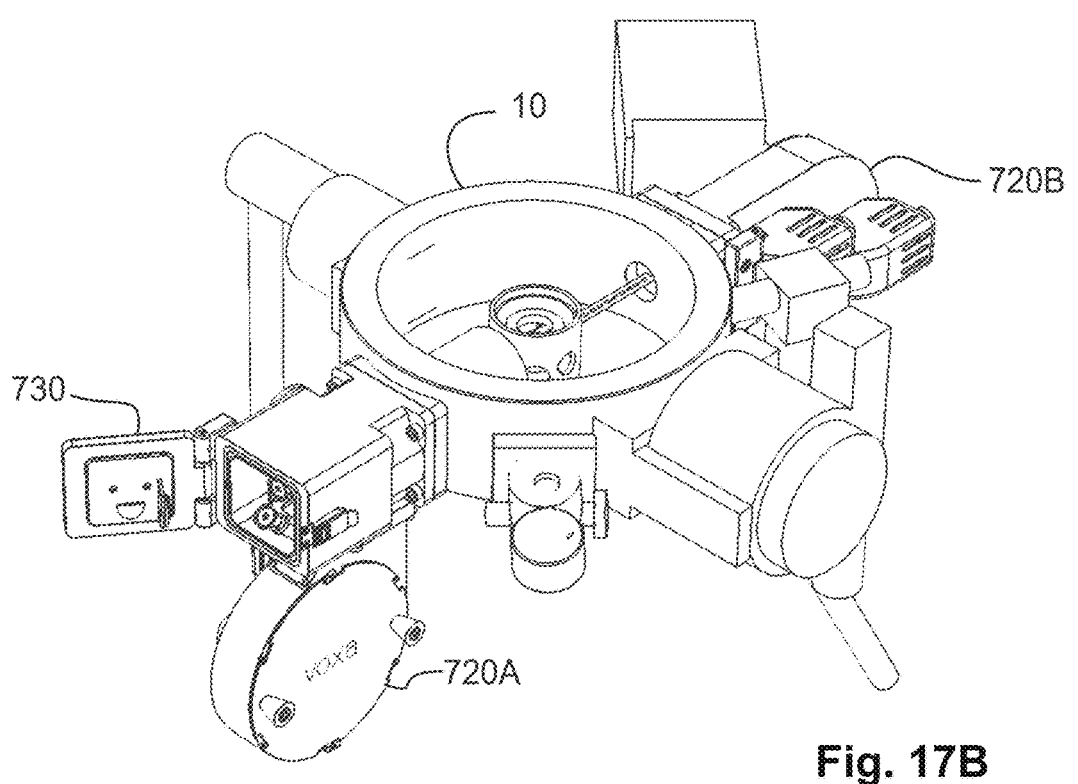
Figure 17C:
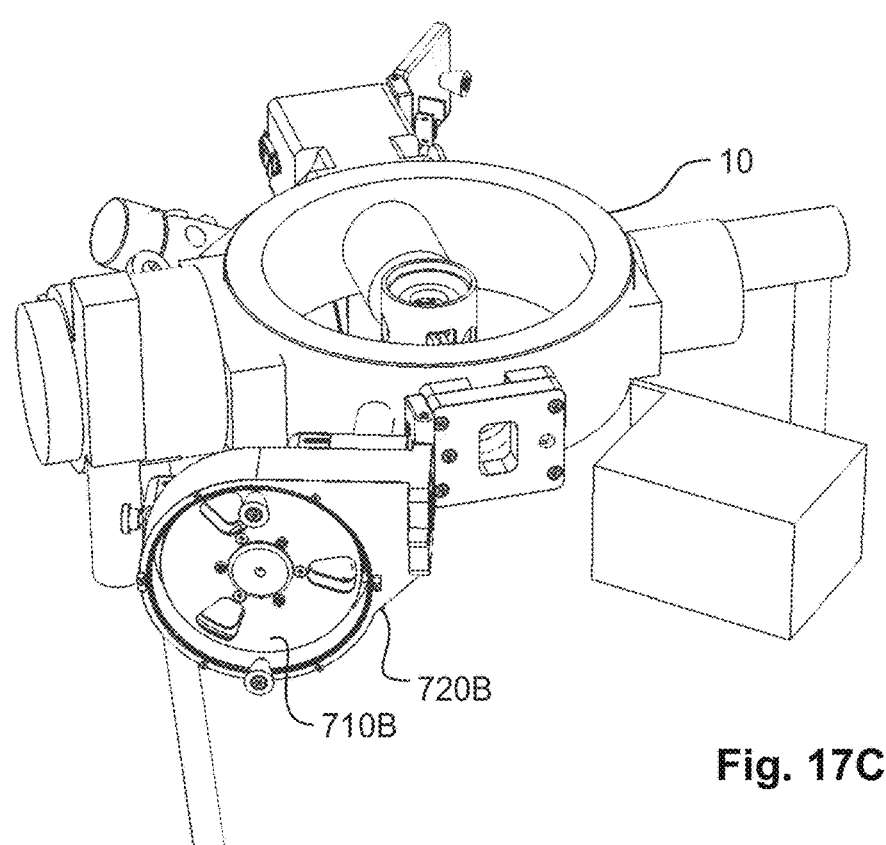

To prepare the automated sample-feeder for operation, a tape containing samples may be loaded into the feed reel. An example is shown in FIG. 17A. A leader (i.e., initial) section of the tape may be threaded from the feed section through the analysis section and into the takeup section. The leader tape may be advanced from the feed reel section into the load lock. Then, the leader tape may be threaded through the cartridge outside the load lock. The cartridge may be inserted into the load lock. (The cartridge in this particular aspect may act as an arm that transfers tape into the microscope system during loading.) The tip of the cartridge, which contains the carriage (with the "y-axis" drive) holds a short section of the leader tape and transfers it through the analysis section (e.g., between the objective lens pole pieces) and through to the takeup side. An example is shown in FIG. 17B. The leader tape may be captured and advanced through a takeup load lock into the takeup section, and finally threaded onto a takeup reel. An example is shown in FIG. 17C.

Figure 17D:
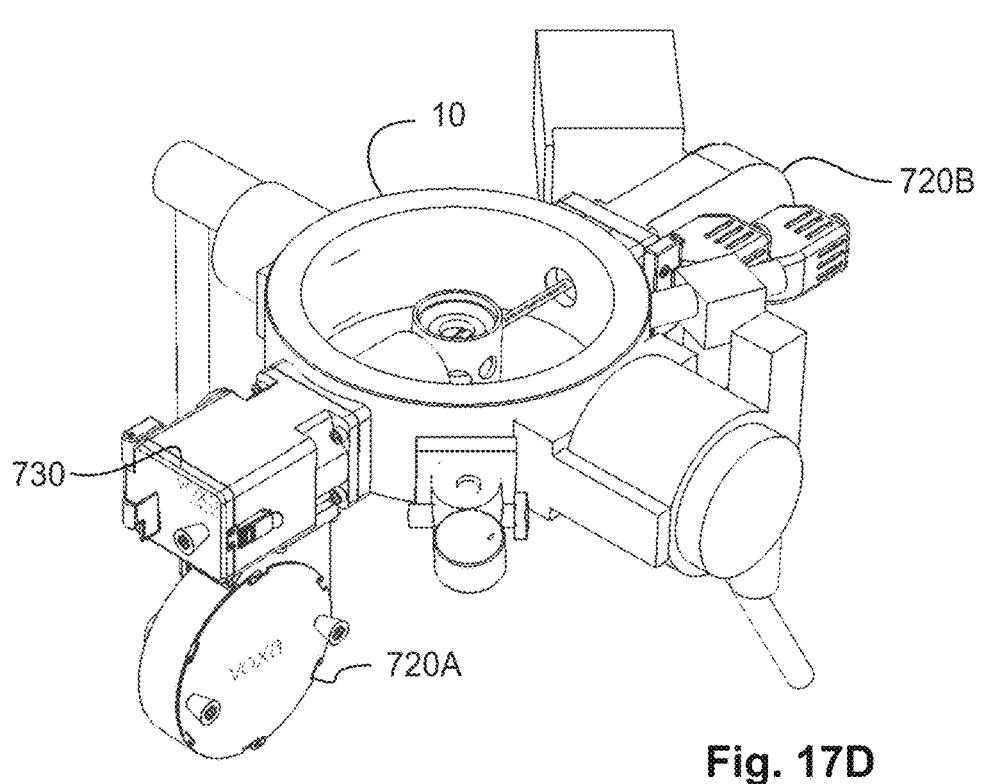

In one embodiment, the entire column and reel housings may be brought up to air during load or unload of a tape. When the system is at air pressure, tape can be loaded into the cartridge, and the cartridge can be inserted and affixed within the column and load lock assembly. The reels can then be loaded and closed off, and the column may be pumped down to operating vacuum. An example is shown in FIG. 17D.

In an alternative embodiment (not shown), the reels may remain at air and be separated from the column volume by an isolation mechanism such as a "whistler" or ferrofluid interface as described above.

Between imaging of subsequent samples, the tape progresses from the feed reel contained within a feed housing through a feedthrough and into the analysis section of the microscope. After analysis, the tape progresses through another feedthrough to a takeup (i.e., collection) reel contained in another housing.

During delivery of a sample into the analysis section, the tape may be tensioned as it is drawn through the analysis section. For sample imaging, however, the tape tension on either side of the analyzer may be relaxed so as to substantially isolate the analysis section from the outside world thermally, mechanically, acoustically, and electromagnetically (except through connections able to carry away or measure excess charge as is typical in the EM). The tape properties may be selected for good isolation, such that good analysis may be achieved, especially under the relaxed condition.

Sequential feeding and imaging of the samples in the analysis section may be substantially or completely automated. For example, the controller may control the automated sample-feeder as well as the components of the microscope. The controller may execute a custom process, which may be made up of smaller sub-processes. These sub-processes may include, for example, monitoring the automated sample-feeder and the microscope (namely, "the microscope system"), performing other actions at certain times and/or conditions, interacting with other external and/or internal processes (e.g., starting, stopping, or checking statuses), and changing properties in the microscope system (e.g., sending a command to another system, setting a voltage on a TTL or CMOS signal, sending a response to a request, setting an event).

Examples of processes relating to the automated sample-feeder may include a process for moving the tape to a specified position or a process for monitoring the status (or "health") of the automated sample-feeder. Multiple processes may be combined into one, and any individual process may itself be composed of smaller processes. For example, the tape moving process may include smaller processes such as tensioning the tape, detensioning the tape, advancing the tape 'n' steps, or retracting the tape 'n' steps.

As processes are executed, the controller may monitor them to gauge the status (or "health") of the microscope system. For example, the measurements can be evaluated periodically to determine whether system performance is varying over long and short timescales. Processes may be monitored in many ways, including determining how long the processes take, what outputs they produce, and what inputs they are given. The results of the process monitoring can be presented in simple, concise fashion (e.g., accessible graphs on website, raw text files, or log files). Regular reports from the system monitoring can be automatically prepared and distributed. For example, such reports could be published on website, or emailed to specified parties.

Limits can be defined at the controller for acceptable values for any monitored variable. If the acceptable range is exceeded, reports detailing the event can be automatically distributed (e.g., website, email, text message, or log message). Reports can be sent immediately or else at specified intervals with a summary of all reports during that interval.

The health monitoring process could perform actions such as (i) checking whether the pressure in the analysis section of the microscope is within sensible limits, and (ii) checking whether the tape tension is within acceptable limits. If any of these, or other, values are outside predetermined limits, actions such as notifying users (either directly/email etc.), logging to a file or emailing a set of addresses can be performed.

Using the framework described above it is possible for processes to interact with internal and external systems in a very connected way. For example, it is possible to add actions at any stage in a process that set a TTL pin low or high (or send data on a port, set a global event, etc.). This could be used to synchronize processes with an external system, for example a camera exposure triggering system. In this manner complex procedures can occur in parallel synchronized with each other.

In a conventional microscope system, exchanging samples typically comes with multiple costs. These costs include the time to exchange the sample, the difficulty of registering previously-analyzed locations on the same or similar samples loaded at different times, the need to track separate indexed samples, the risk for loss or damage during sample load/unload and storage operations, and changes in local environment (e.g., pumping down air to vacuum in electron microscopy). In some cases (e.g., large samples) the microscope must even be opened and closed, incurring an even larger time penalty.

These disadvantages can be eliminated or mitigated when samples are sequentially loaded and independently indexed on a tape medium. The sample exchange can be handled in a single bulk transfer for a plurality of samples. Handling of many samples at once can substantially reduce risk of damage to samples. Indexing can be made simple, and entire volumes may be tracked simply and efficiently.

An automated sample-feeder for a charged-particle beam microscope may be advantageous in various scenarios. For example, the automated sample-feeder may make analysis of large numbers of samples of the same type, such as, for example, in a quality control (QC) application, practical through charged-particle beam microscopy. In another example, the automated sample-feeder may assist in analysis of a continuous process that evolves in time or space. In yet another example, the automated sample-feeder may enable efficient analysis of different locations of a large structure, such as, for example, contiguous slices of brain tissue. Such analyses may be carried out sequentially and systematically, or, alternatively, at nonsequential or random locations.

In one version, a plurality of analytical charged-particle-beam columns is arrayed in series and fed by a single continuous reel-to-reel sample feeder. (Alternatively, robotic arms can transfer samples or samples on discrete carriers between columns for imaging serially.) In such a system, samples may be transferred between columns continuously for parallel analysis or subsequent re-analysis. The interleaving of multiple columns for parallel analysis may be accomplished by staggering their positions slightly such that blocks of samples are advanced simultaneously through the system such that the nth sample in a block is always imaged by the same machine.

FIG. 18 is a schematic diagram of an array 930 of 'n' number of charged-particle-beam columns 500. A feed reel 710A and a takeup reel 710B are provided to supply a continuous flexible tape 580 containing samples to array 930. The figure shows flexible tape 580 being detensioned shortly before and shortly after the imaging area, such as to allow each of the samples to be positioned accurately and shifted or tilted (e.g., by a automated sample-feeder cartridge and/or its carriage).

Different columns in array 930 may be run in different configurations, for example a first column may be run at a different sample tilt angle than a second column. This can enable stereo imaging and/or oversampling of samples, yielding higher resolution composite data, better registration of continuously acquired images, and/or greater understanding of three-dimensional structures. In other examples, different energies, imaging modalities, or radiation types (such as x-rays) may be used across different columns. In such cases, each sample may be analyzed in any combination in sequence, and some steps may even be added or skipped if an analysis produces a result that influences a process decision. Traditionally, there may be a setup time cost for configuring a column in one mode and then reconfiguring the same column for another mode (for example, in generating tilt series). By using a continuous sample feed, however, the same area(s) may be re-imaged multiple times with approximately zero time cost for setup or changing modes.

In EM imaging, it may be preferable for samples to stay in vacuum through entire array 930. However, samples may be taken out of vacuum or gaseous environments may be changed between columns 500 in special cases, such as for an additive or reactive process to be performed between analyses.

Charged-particle beam microscope 10 may have a characteristic area at the plane of sample 20 in which certain imaging characteristics, such as, for example, resolution or other optical characteristics, are selected to be within a range suited to the imaging that is performed. This area may be referred to as the "field of view" of microscope 10 for certain versions. Within the field of view, the charged-particle beam may be scanned in one or more scanning areas across sample 20 while remaining within the desired range of optical characteristics (such as high resolution). For a charged-particle beam, the scanning may be performed by moving stage 40, and potentially also by electronic shifting of the beam, such as by generating an electric or magnetic field.

In one embodiment, stage 40 is adapted to be moved continuously while the charged-particle beam is simultaneously scanned. Such a continuously-moving stage may improve throughput by allowing continuous acquisition of images while eliminating the settling time caused by stop-start motion of a stage that is moved discretely and that may prevent acquisition of a still image of the sample.

Within each field of view, microscope 10 may define one or more scanning areas of sample 20 (i.e., areas in which a charged-particle beam will be scanned) to contribute to the final image. Microscope 10 may perform the imaging of sample 20 in one or more cycles corresponding to the scanning areas, each imaging cycle for a scanning area yielding a contribution that is referred to here as a subimage. Each scanning area may be noncontiguous, contiguous, or overlapping in relation to scanning areas within the same field of view or scanning areas in different fields of view. Moreover, the scanning areas may even be a combination of noncontiguous (i.e., with edges separated by a space), contiguous (i.e., edge to edge), or overlapping.

The controller may stitch together the sub-images to produce a partially or wholly comprehensive image of sample 20. For example, where there are overlapping or contiguous sub-images, these sub-images may be joined together to yield merged image data that is continuous across the corresponding areas. For overlapping sub-images, the controller may use the redundant image information at the overlap to accurately join the sub-images together into a comprehensive image. The controller may automatically control the acquisition of sub-images along a set path, for example a raster pattern or a zig-zag pattern. Further, new data may automatically be integrated into a large map (e.g., a map of substantially the whole sample) as sub-images are acquired so as to fill in the large map with available information.

In one version, microscope 10 is a TEM that is configured with one or more beam scanners for combination stage-beam rastering within, and between, "supertiles." This TEM may be configured to shift the field of view of the charged-particle beam across a sample one or more times between consecutive stage movements. For example, in one embodiment the beam scanners comprise microelectromechanical systems (MEMS) or one or more coil-driven mirrors. Between stage movements, the beam scanners may generate a magnetic and/or electric field to scan the electron beam from field to field. When all fields of view within a "super-tile" have been imaged, the stage is moved to image the next "supertile." Such combination stage-beam rastering across "supertiles" may allow the acquisition and analysis of large areas of samples to be performed quickly and reliably as compared to a conventional stage-only rastering TEM.

Figure 26:
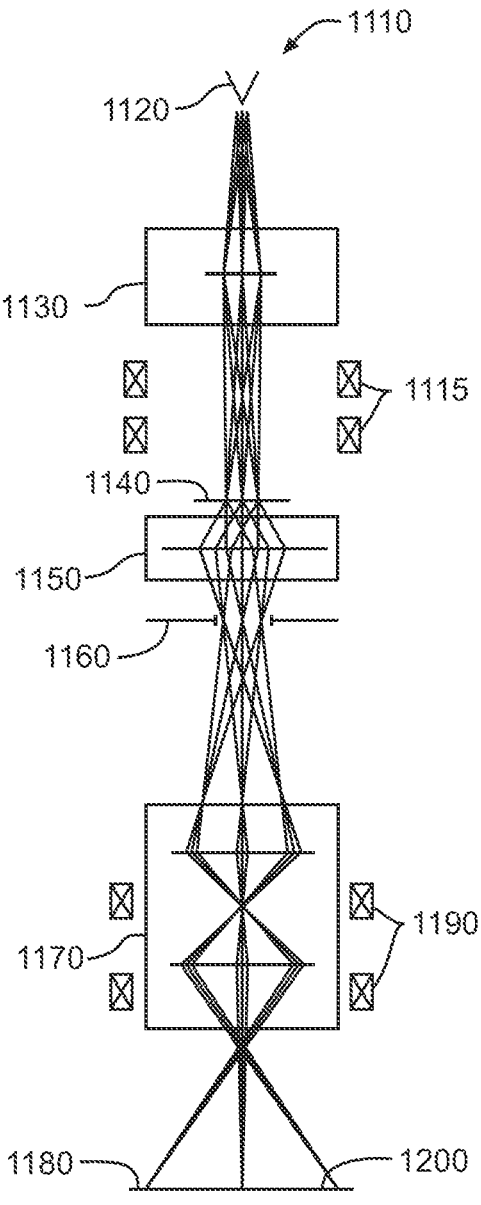
FIG. 26 is a schematic diagram of an exemplary embodiment of a TEM column with a beam scanner and a beam descanner.

FIG. 26 is a schematic diagram of an exemplary embodiment of a TEM column 1110 with a beam scanner 1115 and a beam descanner 1190. Column 1110 has an electron source 1120, one or more condenser lenses 1130, beam scanner 1115, specimen 1140, objective lens 1150, annular aperture 1160, one or more projecting lenses 1170, beam descanner 1190, and detector 1180. Image plane 1200 is shown in the figure. Electron source 1120 and condenser lenses 1130 are configured to provide a variety of illumination conditions.

Figure 27:
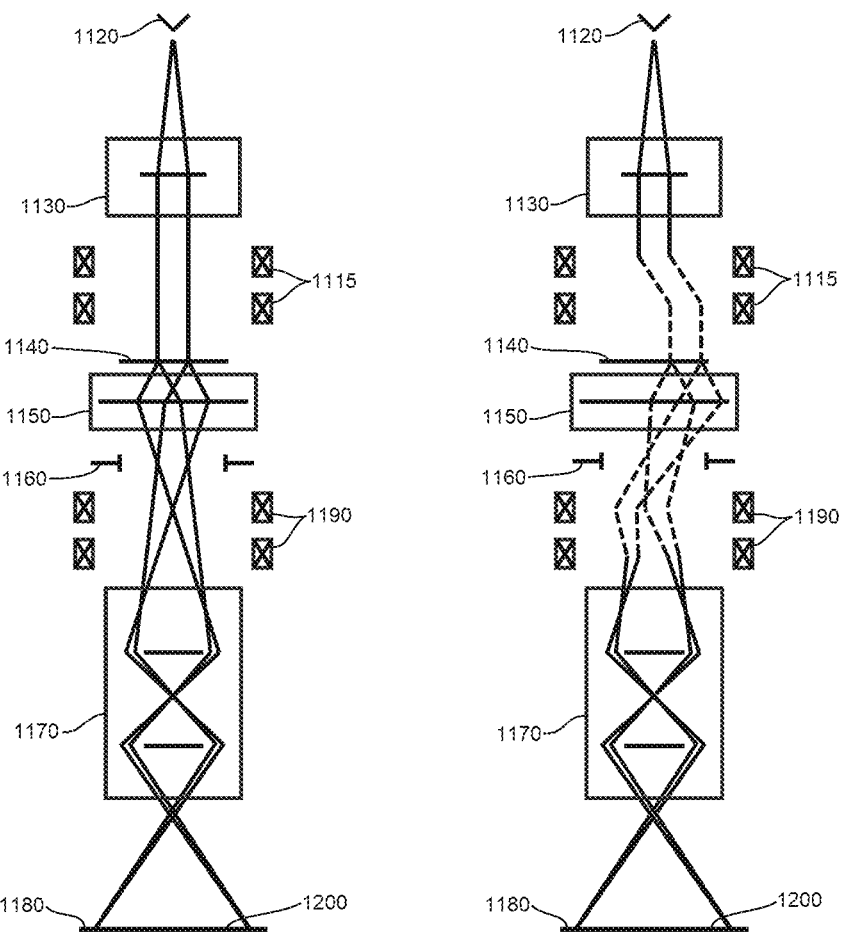
FIG. 27 is another schematic diagram of an exemplary embodiment of a TEM column with a beam scanner and a beam descanner.

FIG. 27 is another schematic diagram of an exemplary embodiment of a TEM column 1110 with a beam scanner 1115 and a beam descanner 1190. This figure illustrates ray diagrams for a central field of view (left column) and a shifted or deflected field of view (right column) in TEM.

FIG. 19 is a schematic top view showing an example of an area 940 of a sample that is desired to be imaged as well as a field of view 950 of a TEM. As shown, field of view 950 may be a fraction of sample area 940. The field of view of a TEM is typically limited by the parameters of desired magnification of the image, physical detector size, and detector pixel array size. Together these parameters constrict the maximum field of view and also the ultimate resolution of the image acquired from the detector, despite the fact that the optical system may be able to form an image larger than this field of view at full microscope resolution. This field of view limits the maximum acquisition rate and increases the amount of required overlap pixels (which are subsequently discarded after being used for tile registration) for tiled acquisition of extremely large sample areas. In one example, for the sake of illustration, the field of view may have a width or diameter of about 16 μm.

FIG. 20 is a schematic top view of an example of same sample area 940 and field of view 950, showing how field of view 950 can be shifted relative to sample area 940 by movement of the stage that holds the sample. FIG. 21 is a schematic top view showing an example of a step path 960 of the sample that is traversed by five consecutive displacements of the stage holding the sample in relation to the electron beam. In raster shifting, one shifting axis may be referred to as the "fast" axis while an orthogonal axis is referred to as the "slow" axis. For example, a shift along the "slow" axis may be performed only after all shifts have been performed in a raster line along the "fast" axis. In the example shown, the controller moves the stage two times downward along the fast axis, one time rightward along the slow axis, and then two times upward along the fast axis.

FIG. 22 is a schematic top view of an example of same sample area 940 and field of view 950, showing how field of view 950 may alternatively be shifted relative to sample area 940 by scanning the electron beam along a step path 970 without stage movement. In this example, the controller shifts the electron beam two times upward along the fast axis, one time leftward along the slow axis, and then two times downward along the fast axis.

Figure 23:
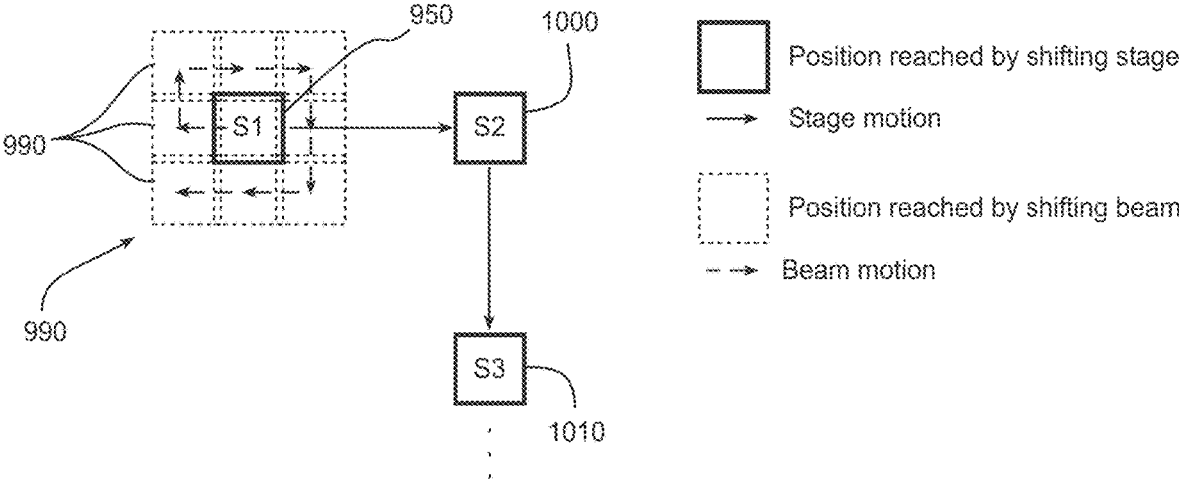

FIG. 23 is a schematic top view of an example of a field of view 950 and neighboring fields of view 980 within different fields of view, which are within range of beam shifting without stage movement. All of these nine fields of view 950, 980 may be collectively referred to as a "super-tile" 990. In the example shown, the electron beam is initially positioned at central field of view 950. Next, the electron beam is shifted leftward to another field of view 980. Then, the electron beam is shifted in a clockwise pattern to each in a sequence of subsequent fields of view 980. In this example, after supertile 990 has been imaged, movement to the central field of view 1000 in a next supertile is accomplished by stage movement. And this repeats for yet another supertile 1010, and so on. Along each axis, the number of mechanical stage motions is reduced by a factor that is the number of supertile sub-images acquired along that axis; correspondingly the total number of mechanical stage motions is reduced by the square of the supertile sub-image count in the case of square supertiles.

Figure 24:
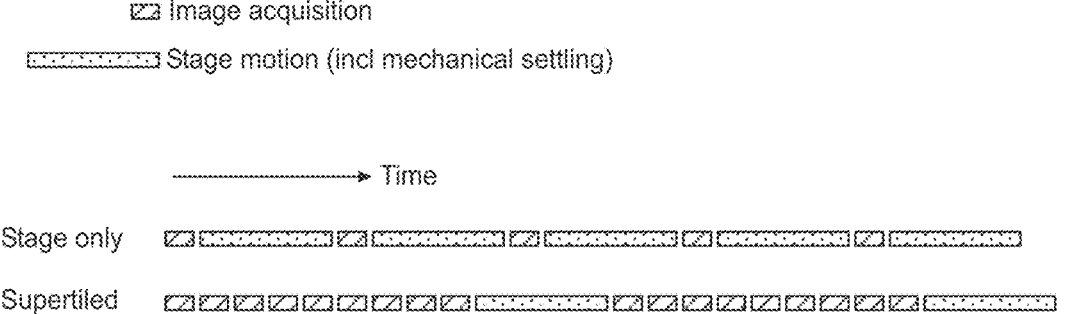
FIG. 24 is a schematic timeline of an example of a comparison between how time is used in a conventional stage-only rastering and how time is used in combination stage-beam rastering.

FIG. 24 is an illustration of timelines of an example of a comparison between how time is used in a conventional stage-only rastering and how time is used in combination stage-beam rastering. The time for stage movement may include not just the rough displacement of the stage itself but additionally the time for positional settling of the stage after each movement. As shown in this figure, "supertiling" through stage-beam rastering can provide several consecutive imaging cycles (of different sub-images) between stage movements, resulting in significantly faster imaging than through stage-only rastering.

The reduction in time to set up for imaging and substantial elimination of delay between shifts across consecutive fields of view, through beam shifting rather than stage movement, may result in per-pixel acquisition that is one or more orders of magnitude faster than in a conventional TEM. In one embodiment, for example, a microscope that has an automated combination stage-beam rastering configuration may be able to acquire images at data rates at least four orders of magnitude faster than conventional instruments. For example, imaging may be performed by a microscope column faster than about 0.1 Mpixel/s (megapixels per second).

Figure 25A:
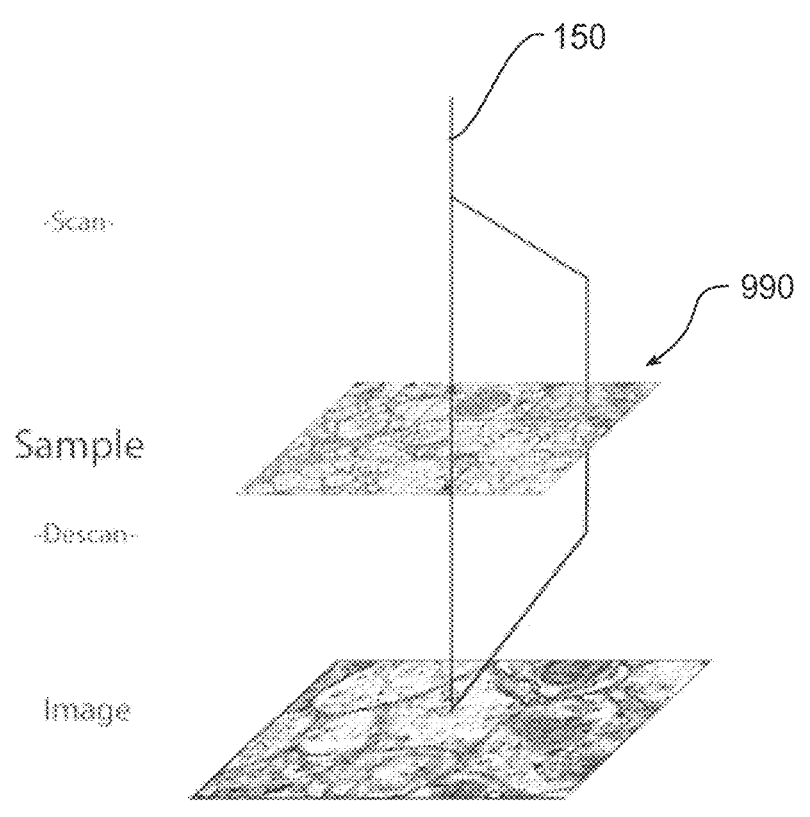
FIGS. 25A and 25B are grayscale illustrations of an example of an embodiment of scanning a nine-field supertile by an electron beam as part of combination stage-beam rastering of a cortical tissue section sample.
Figure 25B:
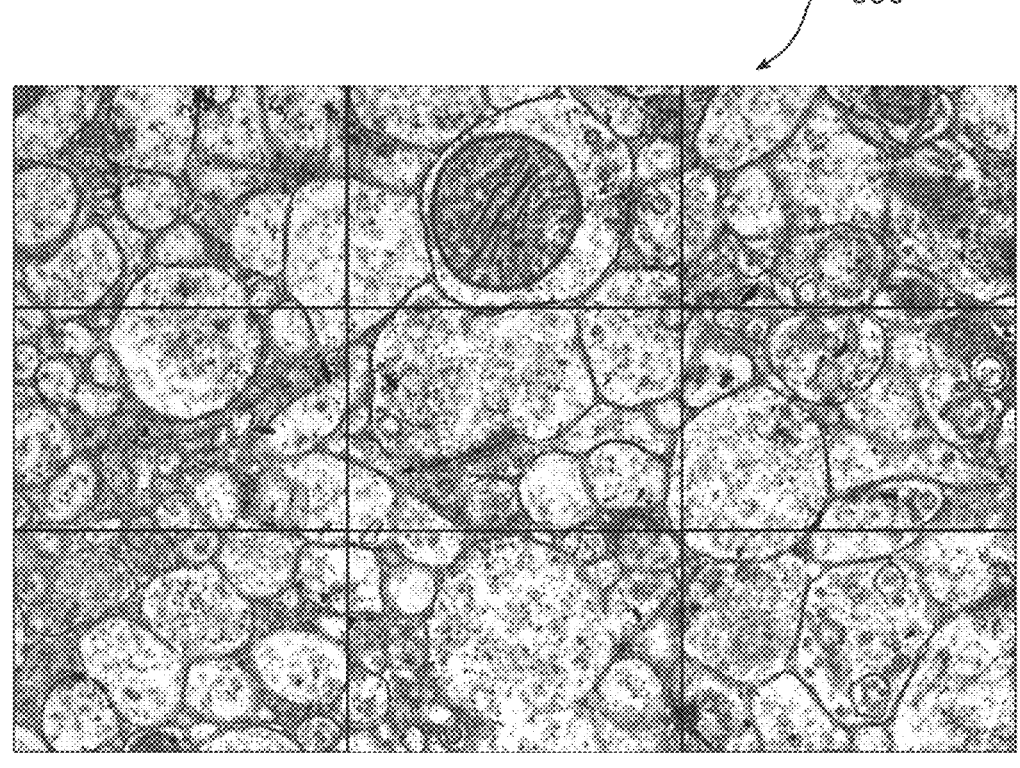

FIG. 25A is an illustration of an example of imaging of a nine-field supertile 990 by electron beam 150 as part of combination stage-beam rastering. Electron beam 150 is sequentially shifted to each of the nine fields of view, where the field of a cortical tissue section is imaged. FIG. 25B shows the imaged nine-field supertile 990 of cortical tissue section that is obtained at a single stage position.

In the example described above, the supertile contains nine fields of view. However, other embodiments are possible. For example, a supertile could encompass four fields of view, wherein the electron beam is shifted clockwise, counterclockwise, or in another pattern from one field of view to the next within the supertile.

In a TEM or scanning microscope (e.g., STEM or SEM), the precise scan paths may be defined according to the particular application. For example, the location of the beam probe or field of view can be set to any position, for any time duration, along the scan path.

In one version, as a new image is being acquired, the controller aligns or otherwise conforms the new image to one or more previously generated images. For example, the controller may process newly detected pixel data to decide on or alter future imaging locations, such as to fill in gaps in imaging or to try to align the new image vertically or horizontally with one or more of the previously generated images. In another example, the controller processes newly detected pixel data to decide on or alter future image resolution or time spent at a particular location. For example, the controller may estimate a likely significance of the image at a predetermined location, and the controller may use that estimate to increase or decrease resolution or another image quality parameter for imaging at that location or nearby. These adjustments can alternatively or additionally be calculated between imaging cycles to affect the next new cycle of image acquisition.

In one embodiment, the controller controls the stage and/or beam scanners to move the beam or probe relative to the sample in a stochastic, path-dependent, or self-correcting fashion. This may be especially advantageous for electron beam microscopy due to the relatively fast response time of the electron beam to the scanning signal. For example, the controller may start creating an image by shifting the electron beam a small amount using a selected one of the beam scanners. The controller may then measure the magnitude of the shift actually produced, and use that measurement to change the amount and direction of the next shift. After more shifts and measurements have been performed, the controller may learn the strength, direction, and repeatability of the beam scanners and/or the stage. The controller may then use this learned information to produce substantially orthogonal or otherwise intentionally directed shifts at a suitable distance for stitching a larger image together. Furthermore, the controller may use the early images, although not acquired using optimal shifts, to prepare the stitched images, such that the time spent characterizing the shifts is not wasted.

Although performing these steps while images are acquired live is possible and may be a preferred operating mode, the analysis may also be performed off-line. Although it may not be possible to optimize shifts for the previously acquired image after it has occurred, that image may provide useful information for future image acquisitions, or may provide more complete information about a sample or operating instabilities when processed altogether, or may further provide information about time dependent events in a sample, such as how a sample evolves in time in a reactive environment.

As another example, as an image is tiled, areas of low or zero contrast may be identified. When images from that region are next imaged, the imaging system could spend less time on that area, or measure it at a lower resolution. This could be done at a faster rate than when acquiring normal quality images and lead to a speed up in total image acquisition time, while not affecting the quality of the image in the important areas. Lower quality images can be checked to insure that they really do represent a low-interest region, and if it is determined they do not, the image could be reacquired at higher or regular resolution.

The controller may also be adapted to increase the quality of the image at or near a feature of interest, and decrease the quality of the image (while increasing imaging speed) with increasing distance from that feature of interest.

The controller may also control the stage and/or beam scanners to produce alternative scanning patterns. For example, the controller may scan the beam or probe across the sample in space-filling curve patterns. Space-filling curves may include, for example, a Hilbert curve, Peano curve, or another suitable type of progressively finer scanning curve. These scans can achieve progressively finer detail over time, such as by incrementally increasing the order of the curve, allowing users to decide whether to continue scan based on coarser, earlier data.

The above methods could be applied in real-time to data as it is acquired and shown to the user immediately. The user could then cancel the acquisition if needed or manually highlight areas of interest that could be acquired at higher quality.

In one version, microscope 10 may generate at least two types of images of sample 20. The first category is survey images, which may be taken to generate a high-framerate survey video. These survey images may be used for tuning the microscope, and finding the appropriate area of the sample on which to conduct more detailed imaging. The second category is high-resolution images. When imaging in the high-resolution mode, the microscope may be slower and less responsive than in the survey mode, but can provide more detail and less noise than the survey images, or signals that may be unavailable at high framerates (e.g., x-ray composition data).

In one embodiment, microscope 10 performs a preliminary, lower-resolution imaging of sample 20 before a principal, higher-resolution imaging of sample 20. The preliminary imaging may be, for example, a faster or lower-dose scan of sample 20 used to determine the locations of one or more features of interest in sample 20. These features may include, for example, a specific cell body with a tag that sets it apart from other cell bodies, or each of multiple polymer strands. This scan may, in one embodiment, cover a substantially contiguous area, rather than being limited to particular and discrete scanning areas. Surveying may also be performed outside of microscope 10, where fiducials on sample 20 or another registration mechanism is provided, such as using a different type of charged-particle microscope or alternatively an optical microscope (such as for fluorescent or light-visible tags).

The controller may then define the scanning areas such that the scanning areas track sample 20 based on the determined location of sample 20. By defining scanning areas that track sample 20, microscope 10 may be able to avoid even more empty area where areas of interest of the sample are not present, eliminating wasteful acquisition of pixels and providing effectively faster imaging speeds. Using the scanning areas, the controller may perform a slower or higher-resolution scan within the scanning areas, thus concentrating the imaging on the actual location of sample 20 and thereby improving efficiency. For example, within each scanning area microscope 10 may raster scan the beam or probe.

Data streamed from microscope 10 by the UI may be adjusted dynamically and automatically such that the user experience is enhanced based on the UI context. For example, microscope 10 may be configured to automatically transition between data densities and latencies based on input from the user to provide an improved user experience. Further, microscope 10 may be configured to predictively acquire and cache image data to be served on a contextual basis to the client UI. While adjustment of datastream mode and latency can be applied to serially-acquired data as well, the above description also applies data acquired through parallel means, such as from a CCD camera.

It is typically desirable to have the image that is produced by the imaging system accurately represent information in the sample needed for analysis. In the ideal case of perfect imaging, the image faithfully reproduces the features of the sample that are needed for analysis. In the real world, however, imaging is often imperfect. In some cases, distortions due to imperfect imaging conditions can result in a warped image. In beam-optical microscopes, these distortions may be caused, for example, by instabilities in the environment such as stray electric or magnetic fields, mechanical vibrations, temperature fluctuations, or internal instabilities such as power supply ripple, ground noise, or periodic electrical discharges.

In a beam-optical microscope, the controller may be adapted to automatically diagnose the magnitudes of various aberrations and apply compensating signals to the optical system, such as to one or more of the optical elements that may cause aberrations and/or the aberration corrector (e.g., aberration corrector 90). Microscope 10 may be especially adapted to correct for two types of image distortions: (1) distortions that are periodic in time, and (2) distortions that are static in time. An example of the first type involves displacement of the beam-probe location due to mains AC fields.

One exemplary method is to raster scan one or more tuning regions of sample 20 to generate an image and to analyze the generated image to extract information about aberrations that can be used to correct the aberrations. The tuning regions may be of any shape or size and may be located within or outside of the areas to be scanned.

Distortions can be diagnosed by analyzing images of the same sample taken using different scan parameters. Based on the types of distortions to correct, more images may be generated that have different rotations, sampling frequency, sampling spacing, magnification, etc. Periodic and static distortions can be extracted from some or all of the above comparisons, based on assumptions about the distortions.

For example, in a conventionally rastered image, wherein the fast "x" direction represents the pixel scan that increments each pixel clock, and the slow "y" direction represents the line scan that increments only after a full pixel width of the field of view is acquired, an image can be recorded with the fast, "x" direction, then another image of the same sample can be acquired in a direction that is rotated by approximately 90 degrees in relation to the previous "x" direction. By comparing the location of features between the two images of the same sample, a map of distortion can be calculated across either image.

Once distortions are measured the data can be presented to the user as a measure to help diagnose instabilities. It could also be used as input to a post processing algorithm to remove distortions. This algorithm could be applied to future images assuming the distortions remain constant. It could also be used and fed back in to the scanning unit to correct for the distortions by changing the scanning locations (e.g., moving the beam to a location where adding the measured distortion will place the beam at the required location). Following the application of any of these or other correcting techniques, the process could be applied again iteratively, each time measuring and potentially correcting finer distortions.

A sample used for the purposes of diagnosing aberrations in a charged-particle beam microscope may contain, for example, single atoms or clusters of atoms, or may be another kind of sample adapted to permit microscope 10 to diagnose optical aberrations. For example, the sample may be the same sample 20 that is also the subject of interest for study. Alternatively, the sample may be a reference sample used solely for calibration of microscope 10. Distortions relative to the known structure of the reference sample can then be extracted.

The tuning region may be positioned to account for workflow convenience. For example, the tuning region may be located at a default (or "home") position of stage 40 so that it may be used to tune microscope 10 prior to imaging sample 20 and the user can always be presented with a substantially optimized image of sample 20.

An identification pattern may be created on sample 20 temporarily or permanently. For example, the identification pattern may be a removable sample label that is placed on sample 20 or a sample holder, or patterned onto sample 20 or the sample holder using an electron beam of microscope 10 adjusted with elevated current. The patterning could be carried out on a beam-sensitive label area of sample 20, comprising, for example, a beam-sensitive sacrificial polymer, or an etchable substrate catalyzed by exposure to a beam. Alternatively, the identification pattern may be etched onto sample 20. The identification pattern may contain a unique identification code that can be determined when the pattern is read by one or more means. For example, the pattern may comprise a miniature bar code, QR code, or another type of code based on a geometric pattern. The pattern may be visible to photons and/or charged particles. The identification code may be inserted into the metadata of images of the sample that are generated by the microscope, providing convenient tracking of the sample.

A reference pattern may also be placed on the sample to enable quick calibration of microscope 10, such as focusing, rotation calibrations, and magnification calibrations, by imaging of the reference pattern. For example, microscope 10 may perform this calibration substantially automatically. The reference pattern may be placed at a location of the sample that is predetermined relative to the stage. The same reference pattern may be used on different samples to enable microscope 10 to be calibrated by imaging the reference pattern.

Furthermore, a combination identification/reference pattern may be provided in which the pattern provides an identification code and the same pattern is also used for calibration of the microscope. In this version, microscope 10 may, on insertion of the sample, read the identification code from the pattern and simultaneously calibrate microscope 10 based on the pattern, readying microscope 10 for imaging of the sample.

As a charged-particle beam microscope is operated, various parameters may undesirably vary over time. This may conventionally necessitate vigilance and maintenance by the user. For example, the user may have to monitor the parameters and, for example, instruct the controller to turn off the charged-particle beam source if a particular value falls below a predefined threshold. This may increase the burden on the user and negatively impact ease of use of the microscope.

To address this, the controller may automatically monitor important operating parameters. The controller may also automatically make changes to keep the parameters within suitable ranges. Alternatively, the controller may make these changes at times that are appropriate or convenient to the user, such as between imaging cycles.

In one example of charged-particle beam microscopy, the controller monitors the emission current to maintain desired operating conditions of microscope 10. The controller can change the emission current by varying the voltage at the Wehnelt. However, doing so while imaging may cause detrimental effects in the images. Therefore, the controller may vary the voltage at the Wehnelt to make these adjustments at times that imaging is not occurring.

In another example of charged-particle beam microscopy, the controller may monitor the filament temperature, resistance, and/or current and adjust the power supply accordingly to keep these values within predefined (e.g., user-defined) ranges. The controller may optionally make these adjustments only at appropriate times, such as when image acquisition is not occurring.

Thus, by automatically monitoring and correcting those parameters, microscope 10 may substantially avoid the need for human intervention in regard to those parameters and therefore even be able to hide the existence of those parameters from the user. This can make operation of microscope 10 much simpler and easier for the user, who can in turn focus on his or her ultimate desired use of microscope 10.

The controller may also evaluate information originating at one or more of the detectors of a beam-optical microscope, either between imaging cycles or simultaneous with imaging, to determine the current quality of imaging. In one version, imaging information from dedicated "tuning regions" is used. However, the images themselves may additionally or alternatively be used. For example, information from the most recent images can be used to determine trends of tuning deterioration. This evaluation can be used to set parameters of microscope 10 to improve the quality of imaging. For example, referring to FIG. 1 for the sake of illustration, the parameters may be applied to condenser lenses (e.g., condenser lenses 70A-C), the objective lens (e.g., objective lens 100), the aberration corrector (e.g., aberration corrector 90), and the stage (e.g., stage 15). In an illustrative example, the parameters applied to the condenser lenses, the objective lens, and the stage may improve the focus, while the parameters applied to the aberration corrector may compensate for higher orders of aberration. This process may be referred to as "re-tuning" the microscope.

It may be desirable to maintain the microscope in a substantially steady state in terms of contamination and stability during imaging. But the performance of the optical system of a charged-particle beam microscope may tend to deteriorate over time. In one example, the optical system of a charged-particle beam microscope may deteriorate to an undesirable state in from about 5 to about 30 minutes, such as about 15 minutes. When this happens, it may become advantageous to perform re-tuning. In one version, first-order and second-order aberrations may be especially prone to deterioration and/or advantageous to compensate for by re-tuning. The charged-particle beam source may also deteriorate over time. To refresh the charged-particle beam source, it can be "flashed" by running a high current through it between beam scanning cycles. This causes a localized heating of the filament that reconditions the source.

Re-tuning of a charged-particle beam microscope may be triggered according to any suitable procedure. The controller may monitor the microscope to initiate the determination of imaging quality, the controller may automatically initiate re-tuning at regular intervals, or the controller may poll a store of recently generated images to determine image quality as a background process. For example, the re-tuning may be triggered within any desired time interval, such as within any quantity of hours or minutes, or subsequent to any quantity of images generated by the microscope or every Nth linear scan or scan cycle performed by the microscope. In an exemplary embodiment, the controller initiates re-tuning between sequential fields of view. In another embodiment, however, the controller can re-tune the optical system between sequential scanning areas.

At each of the sub-areas, microscope 10 may image a tuning region within or outside of the sub-area one or more times to generate one or more sub-images that can be used to track the sample and/or produce imaging metadata. The imaging metadata may include, for example, focus error and amounts of various orders of aberration, and beam current.

The controller may use the imaging metadata to modify parameters to improve image quality, such as, for example, to autofocus the image at the elevation of sub-area. For example, the controller may evaluate several sub-images taken in a particular area to determine the magnitude and direction of focus error. Using this information, microscope 10 can generate a final well-focused sub-image that will be used for evaluation of the sample itself. Microscope 10 may use any number of sub-images of a sample to determine imaging metadata. The sub-images may cover any desired variation range for a particular parameter.

In analyzing an image, the controller may analyze any suitable characteristics of the image, such as intensity, pixel counts, or power, each of which may be analyzed in real space or in frequency space (so that intensity may be within or outside of a spatial frequency range). When comparing images or evaluating a series of images, the controller may utilize any suitable characteristic that differs between the images, such as in a preselected region of the images.

The controller may also use any number of images for the image quality comparison, where the image quality values for current and prior images may be combined in any suitable fashion, such as averaged, weighted, or summed. A user threshold for image quality may be set to any suitable value. A comparison of image quality values may utilize any mathematical or statistical operations to determine image quality compliance, such as a comparison, statistical variance, or deviation.

The imaging process may be performed automatically, such as after initiation by a user or initiation by a larger process of which the imaging is a subprocess. Parameters may be determined automatically and applied to the microscope. Alternatively, any part of the technique, such as image generation, determination of parameters, or application of the parameters, may be performed manually. For example, the controller or a separate computer system may provide the optimal settings to a technician who manually applies the settings to the microscope. The microscope controller may perform any desired processing, such as monitoring and adjustment of optical parameters or image formation and processing. For example, the controller may align images using image registration algorithms. The controller of a beam-optical microscope may also adjust the aberrations and defocus of an image based on characteristics of a previous image.

Microscope 10 may be used in any suitable facility in any desired arrangement, such as networked, direct, or indirect communication arrangements. Moreover, the various functions of microscope 10 may be distributed in any manner among any quantity of components, such as one or more hardware and/or software modules or units. The hardware may include microscopes, machine managers, computer or processing systems, circuitry, networks, and image stores, that may be disposed locally or remotely of each other and may communicate with each other or be coupled to each other in any suitable manner, such as wired or wireless, over a network such as WAN, LAN, Intranet, Internet, hardwire, or modem, directly or indirectly, locally or remotely from each other, via any communications medium, and utilizing any suitable communication protocol or standard. The software and/or algorithms described above may be modified in any manner that accomplishes the functions described herein.

Electron microscope 10 described herein may be implemented with either electrostatic or magnetic components or a combination thereof. The EM may include any quantity of electrostatic, electromagnetic, or magnetic components, such as an electron or other charged-particle gun, lenses, a dispersion device, stigmators, deflectors, detectors, and stages, arranged within or outside of the microscope in any suitable fashion.

Image stores, files, and folders used by microscope 10 may be of any quantity and may be implemented by any storage devices, such as memory, database, or data structures. Implementation of aspects of the microscope, such as image processing or the user interface, may be distributed among the controller or other processing devices in any desired manner, where these devices may be local or remote in relation to one another. Furthermore, functionality of the controller may be implemented in hardware, software, or any suitable combination of hardware and software. The controller may communicate with and/or control the microscope to perform any desired functions, such as scanning the sample and generating the images or transferring images to memory.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein.

In this specification, various preferred embodiments have been described with reference to the accompanying drawings. It will be apparent, however, that various other modifications and changes may be made thereto and additional embodiments may be implemented without departing from the broader scope of the claims that follow. The specification and drawings are accordingly to be regarded in an illustrative rather than restrictive sense.

We claim:

1. A transmission electron microscope (TEM) for imaging a sample, the microscope comprising:

a stage to hold and move a sample;

an electron beam column to direct a substantially parallel electron beam onto the sample, the electron beam column defining an optic axis, the electron beam column comprising:

an electron beam source to generate an electron beam along an optic axis, electron beam optics to condense the electron beam to form a substantially parallel electron beam at the sample in a TEM mode, and a beam scanner to shift the substantially parallel electron beam across multiple areas on the sample such that the electron beam is substantially parallel to the optic axis at the sample;

beam optics to realign an electron beam emanating from the sample with the optic axis;

a detector to detect the electron beam emanating from the sample to generate image data; and a controller adapted to automatically (i) define a plurality of supertiles that divide an area of the sample to be imaged, (ii) control the stage to move the sample relative to the beam between the supertiles, (iii) control the beam scanner to shift the beam across each of the multiple areas within each supertile in between stage movements, (iv) analyze the image data to generate a sub-image for each of the multiple areas on the sample, and (v) stitch together the sub-images to generate a larger image of the sample.

2. A transmission electron microscope according to claim 1, wherein the controller is adapted to control the beam scanner to sequentially shift the electron beam across at least four adjacent or overlapping areas on the sample, without moving the stage between the shifts.

3. A transmission electron microscope according to claim 1, wherein the controller is adapted to control the beam scanner to sequentially shift the electron beam across at least nine adjacent or overlapping areas on the sample, without moving the stage between the shifts.

4. A transmission electron microscope according to claim 1, wherein the controller is adapted to analyze the image to generate a feedback signal to control the beam scanner.

5. A transmission electron microscope according to claim 1, wherein the beam scanner comprises electromagnetic coils.

6. A transmission electron microscope according to claim 1, wherein the beam scanner comprises electrostatic deflectors.

7. A transmission electron microscope according to claim 1, wherein the controller is further adapted to re-tune one or more of the electron beam optics and the beam scanner between sequential areas.

8. A transmission electron microscope according to claim 1, wherein the controller is further adapted to move the stage between sets of shifts to a plurality of the areas.

9. A transmission electron microscope according to claim 1, wherein the controller is further adapted to select an area that has not previously been illuminated.

10. A transmission electron microscope according to claim 1, wherein the stitched-together image of the multiple areas is larger than a pixel array size of the detector.

11. A transmission electron microscope according to claim 1, wherein the controller is adapted to stitch together the sub-images to generate the larger image of the sample while the detector detects the electron beam emanating from the sample.

12. A transmission electron microscope according to claim 1, wherein the controller is adapted to generate aberration metadata for each of a plurality of the multiple areas within at least one of the supertiles and to use the aberration metadata to compensate for aberrations.

13. A method for imaging a sample in a transmission electron microscopy (TEM) mode, the method comprising:

holding a sample in a low-pressure environment;

defining a plurality of supertiles that divide an area of the sample to be imaged;

generating an electron beam along an optic axis;

condensing the electron beam to form a substantially parallel electron beam at the sample in a TEM mode;

moving the sample relative to the beam between the supertiles;

between movements of the sample, shifting the substantially parallel electron beam across multiple adjacent or overlapping areas within each supertile on the sample such that the electron beam is substantially parallel to the optic axis at the sample;

realigning an electron beam emanating from the sample with the optic axis;

detecting the electron beam emanating from the sample to generate image data;

analyzing the image data to generate a sub-image for each of the areas on the sample; and stitching together the sub-images to generate a larger image of the sample.

14. A method according to claim 13, comprising sequentially shifting the electron beam across at least nine adjacent or overlapping areas on the sample, without moving the stage between the shifts.

15. A method according to claim 13, comprising:

analyzing the image to generate a feedback signal; and controlling the beam shifting based at least in part on the feedback signal.

16. A method according to claim 13, further comprising feeding a flexible tape, which comprises a plurality of samples deposited thereon, into the low-pressure environment.

17. A method according to claim 13, further comprising performing a re-tuning of an optical system between sequential areas.

18. A method according to claim 13, further comprising moving the stage between sets of shifts to a plurality of the areas.

19. A method according to claim 13, further comprising selecting an area that has not previously been illuminated.

20. A method according to claim 13, wherein stitching together the sub-images to generate the larger image of the sample comprises stitching together the sub-images while detecting the electron beam emanating from the sample.

* * * * *